(12) United States Patent
Ishizaki

(10) Patent No.: US 11,709,406 B2
(45) Date of Patent: Jul. 25, 2023

(54) THIN-FILM TRANSISTOR ARRAY AND METHOD OF PRODUCING THE SAME

(71) Applicant: TOPPAN PRINTING CO., LTD., Tokyo (JP)

(72) Inventor: Mamoru Ishizaki, Taito-ku (JP)

(73) Assignee: TOPPAN PRINTING CO., LTD., Tokyo (JP)

(*) Notice: Subject to any disclaimer, the term of this patent is extended or adjusted under 35 U.S.C. 154(b) by 0 days.

(21) Appl. No.: 17/318,194

(22) Filed: May 12, 2021

(65) Prior Publication Data

US 2021/0263356 A1 Aug. 26, 2021

Related U.S. Application Data

(63) Continuation of application No. PCT/JP2019/043377, filed on Nov. 6, 2019.

(30) Foreign Application Priority Data

Nov. 12, 2018 (JP) .................................. 2018-212157

(51) Int. Cl.
*G02F 1/1368* (2006.01)
*G02F 1/1362* (2006.01)

(52) U.S. Cl.
CPC ...... *G02F 1/1368* (2013.01); *G02F 1/136213* (2013.01); *G02F 1/136277* (2013.01); *G02F 1/136286* (2013.01)

(58) Field of Classification Search
CPC ............. G02F 1/1368; G02F 1/136213; G02F 1/136277; G02F 1/136286;
(Continued)

(56) References Cited

U.S. PATENT DOCUMENTS 7,388,633 B2 * 6/2008 Iwasa ................ G02F 1/136209
257/59
2002/0060756 A1 5/2002 Kurashina
(Continued)

FOREIGN PATENT DOCUMENTS

CN 108350260 A * 7/2018 ........... C08G 64/307
JP 2003-233786 A 8/2003
(Continued)

OTHER PUBLICATIONS

International Search Report dated Dec. 24, 2019 in PCT/JP2019/043377, filed Nov. 6, 2019, (with English Translation).
(Continued)

*Primary Examiner* — Hoan C Nguyen
(74) *Attorney, Agent, or Firm* — Oblon, McClelland, Maier & Neustadt, L.L.P.

(57) ABSTRACT

A thin-film transistor array includes an insulating substrate and pixels each including a thin-film transistor, a pixel electrode, and a capacitor electrode, the pixels being formed in a matrix and located at positions where column wirings extending in a column direction intersect row wirings perpendicular to the column wirings and extending in a row direction. The thin-film transistor includes a gate electrode, a source electrode, a drain electrode, and a semiconductor pattern formed between the source electrode and the drain electrode. The pixel electrode includes two electrically conductive layers which are a lower layer electrode serving as a lower pixel electrode, and an upper layer electrode serving as an upper pixel electrode. The corresponding one of the column wirings is at a position which has no overlap with the capacitor electrode and the lower pixel electrode, and has an overlap with the upper pixel electrode, in the lamination direction.

20 Claims, 22 Drawing Sheets

(58) Field of Classification Search
CPC ............. G02F 1/133345; G02F 1/1343; G02F 1/136227; G09G 3/3648; G09G 2300/0876; G09G 2300/0439; G09G 2300/0426; H01L 27/1255; H01L 27/1251; H01L 27/3262; H01L 27/3265; H01L 27/3276; H01L 33/0054; H01L 51/5203; H01L 27/124; H01L 27/1222; H01L 29/41733; H01L 29/42384; H01L 27/1248; H01L 29/4908; H01L 29/66757; H01L 29/786; H01L 29/78675

See application file for complete search history.

(56) References Cited

U.S. PATENT DOCUMENTS

| | | | |
|---|---|---|---|
| 2006/0061713 A1* | 3/2006 | Nakamura | G02F 1/133555 349/113 |
| 2008/0094554 A1* | 4/2008 | Sato | G02F 1/133555 349/114 |
| 2011/0101361 A1 | 5/2011 | Von Werne et al. | |
| 2012/0057116 A1* | 3/2012 | Yang | G02F 1/134363 349/139 |
| 2012/0138943 A1 | 6/2012 | Nakahara et al. | |
| 2016/0209715 A1* | 7/2016 | Rho | G02F 1/136286 |

FOREIGN PATENT DOCUMENTS

| | | | | |
|---|---|---|---|---|
| WO | WO 01/82273 A1 | 11/2001 | | |
| WO | WO-0182273 A1 * | 11/2001 | ....... | G02F 1/136213 |
| WO | WO 2011/021439 A1 | 2/2011 | | |

OTHER PUBLICATIONS

Extended European Search Report dated Nov. 29, 2021 in European Patent Application No. 19884995.2, 11 pages.

* cited by examiner

THIN-FILM TRANSISTOR ARRAY AND METHOD OF PRODUCING THE SAME

CROSS-REFERENCE TO RELATED APPLICATIONS

The present application is a continuation of International Application No. PCT/JP2019/043377, filed Nov. 6, 2019, which is based upon and claims the benefits of priority to Japanese Application No. 2018-212157, filed Nov. 12, 2018. The entire contents of all of the above applications are incorporated herein by reference.

BACKGROUND OF THE INVENTION

Field of the Invention

The present invention relates to thin-film transistor arrays and methods of producing the transistor arrays.

Discussion of the Background

Transistors using semiconductor substrates, or amorphous silicon (a-Si) or polysilicon (poly-Si) thin film transistor (TFT) arrays using glass substrates based on integrated circuit technology have been produced for application to liquid crystal display devices (liquid crystal displays) or other devices.

Thin-film transistors serve as switches. Specifically, when a thin-film transistor is turned on by a selection voltage applied to the row wiring, a signal voltage supplied to the column wiring is written into the pixel electrode connected to the drain electrode. Hereinafter, the row wiring is referred to as a gate wiring, and the column wiring is referred to as a source wiring. The write voltage in this case is held by the storage capacitor provided between the drain electrode or the pixel electrode and the capacitor electrode.

In a thin-film transistor array, functions of source and drain of a thin-film transistor are interchangeable depending on the polarity of the signal voltage written into the pixel electrode. Thus, depending on the operation, sources and drains cannot be uniquely determined in thin-film transistors. For this reason, in the following description, the electrodes connected to column wirings are referred to as sources, while the electrodes connected to pixel electrodes are referred to as drains so that sources and drains can be consistently referred to.

In a thin-film transistor array, a phenomenon called gate-feedthrough may occur, in which the pixel potential changes when a thin-film transistor is switched from an on state to an off state by the potential of the gate wiring (termed gate potential hereinafter). Due to the gate-feedthrough phenomenon, the pixel potential changes by a voltage (termed gate-feedthrough voltage hereinafter) Vgf as expressed by the following Formula (1). This voltage change is required to be kept within a few volts.

$$Vgf = \Delta Vg \times Cgd / (Cgd + Cs + Cp) \quad (1)$$

In Formula (1), $\Delta Vg$ is a variation in gate potential (termed gate potential variation hereinafter), Cgd is a capacitance between gate and drain (termed gate-drain capacitance hereinafter), Cs is a capacitance between pixel electrode and capacitor electrode (termed storage capacitance hereinafter), and Cp is a capacitance of a display medium per electrode (termed display medium capacitance hereinafter).

It will be understood from Formula (1) that the storage capacitance Cs can be omitted if the display medium capacitance Cp is great. It will also be understood from Formula (1) that the storage capacitance Cs is required if the display medium capacitance Cp is small. However, the display medium capacitance Cp can be ignored if it is extremely smaller than the storage capacitance Cs.

Such thin-film transistor arrays have been applied to liquid crystal display devices (liquid crystal displays), and the techniques thereof have been developed. In recent years, there have been developed display devices in which a thin-film transistor array is combined with an electrophoretic medium. Such display devices are also called electronic paper display devices.

The electronic paper display devices are anticipated as display devices using lower electrical power than liquid crystal display devices. Generally used liquid crystal display devices can display data only while being driven, and are required to continue being driven to retain the display. In this regard, electrophoretic type electronic paper display devices can retain the display after termination of driving and thus are not required to be continuously driven.

Furthermore, in recent years, there has also been proposed a display device as disclosed in PTL1, for example, in which an electronic paper display device is combined with an RFID (radio frequency identification) device that uses an object recognition technique. According to PTL1, data related to the contents of a container is stored in an RFID device, and the contents data is displayed on a display device affixed to the container. In this way, there have been disclosed display media enabling visual recognition of the contents of containers.

PTL 1: JP 2003-233786 A

SUMMARY OF THE INVENTION

According to an aspect of the present invention, a thin-film transistor array includes an insulating substrate, and pixels each including a thin-film transistor, a pixel electrode, and a capacitor electrode, the pixels being formed in a matrix and located at positions where column wirings extending in a column direction intersect row wirings perpendicular to the column wirings and extending in a row direction. The thin-film transistor includes a gate electrode, a source electrode, a drain electrode, and a semiconductor pattern formed between the source electrode and the drain electrode. The semiconductor pattern is at a position that aligns with the gate electrode in a lamination direction via a gate insulating film. The capacitor electrode is positioned over the thin-film transistor in the lamination direction via an interlayer insulating film. The pixel electrode is positioned over the capacitor electrode in the lamination direction via a capacitor insulating film. The source electrode is connected to a corresponding one of the column wirings. The gate electrode is connected to a corresponding one of the row wirings. The drain electrode is connected to the pixel electrode. The capacitor electrode is connected to a capacitor wiring. The pixel electrode includes two electrically conductive layers which are a lower layer electrode serving as a lower pixel electrode, and an upper layer electrode serving as an upper pixel electrode. An intermediate insulating film is sandwiched between the lower pixel electrode and the upper pixel electrode. The upper pixel electrode is connected to the lower pixel electrode through an opening of the intermediate insulating film. The capacitor electrode has an overlap with the lower pixel electrode, which provides capacitance. The corresponding one of the column wirings is at a position which has no overlap with the capacitor electrode and the lower pixel electrode, and has an overlap with the upper pixel electrode, in the lamination direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
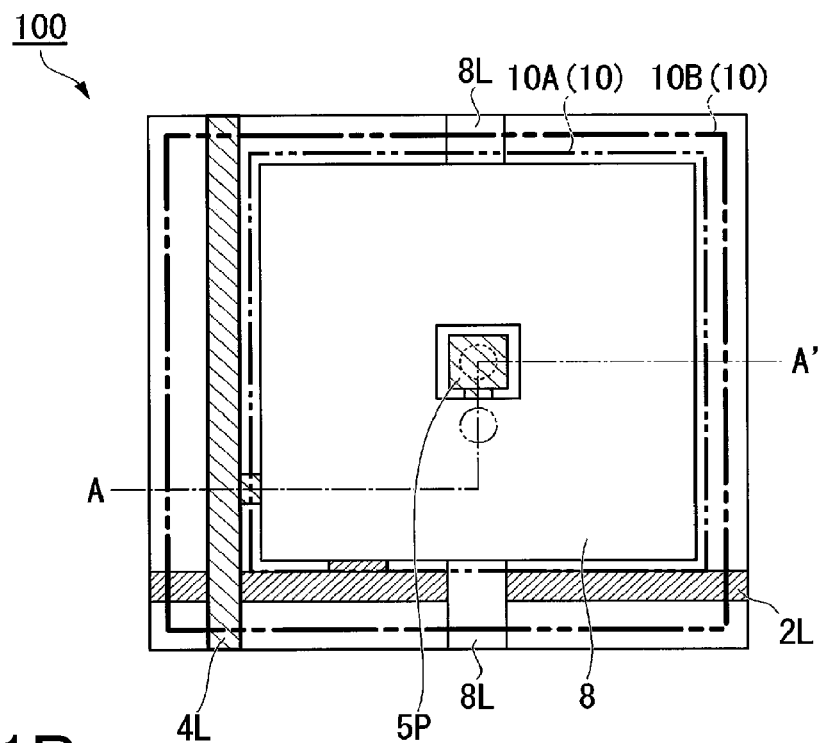
FIG. 1A is a diagram illustrating an example of a structure of a thin-film transistor array according to a first embodiment.

The embodiments will now be described with reference to the accompanying drawings, wherein like reference numerals designate corresponding or identical elements throughout the various drawings.

First Embodiment

Figure 1B:
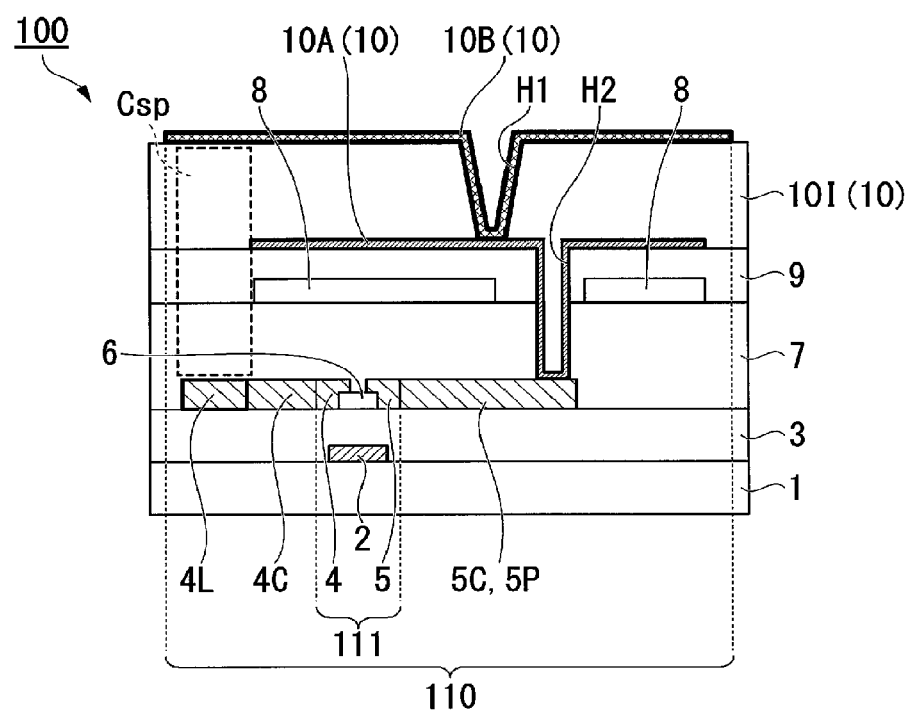
FIG. 1B is a schematic cross-sectional view illustrating a structure taken along the line A-A' of FIG. 1A.

With reference to the drawing, some embodiments of the present invention will be described. FIGS. 1A and 1B are diagrams illustrating an example of a structure of a thin-film transistor array according to a first embodiment. In FIGS. 1A and 1B, the structure of the thin-film transistor array is schematically shown. Hereinafter, the thin-film transistor array is referred to as a thin-film transistor array 100. The thin-film transistor array 100 includes pixels each of which is provided with one thin-film transistor (TFT). Hereinafter, the thin-film transistor is referred to as a thin-film transistor 111, and each pixel is referred to as a pixel 110. More specifically, FIG. 1A is a schematic plan view showing a structure of a pixel 110 formed in the thin-film transistor array 100. FIG. 1B is a schematic cross-sectional view taken along the line A-A' of the plan view of the pixel 110 shown in FIG. 1A. In the plan view of the pixel 110 shown in FIG. 1A, some components (lower pixel electrode 10A and upper pixel electrode 10B) are shown only by contours thereof for ease of understanding the positions of the components formed in lower layers.

The thin-film transistor array 100 is formed on an insulating substrate 1. In the thin-film transistor array 100, a plurality of column wirings 4L are disposed so as to extend in the column (longitudinal) direction, and a plurality of row wirings 2L are disposed so as to extend in the row (lateral) direction perpendicular to the column wirings 4L. At positions where the column wirings 4L intersect the row wirings 2L in the thin-film transistor array 100, respective pixels 110 are disposed. Specifically, a plurality of pixels 110 are arranged in a matrix along the column wirings 4L and the row wirings 2L. More specifically, in the thin-film transistor array 100, the pixels 110 are disposed in regions which are defined in a matrix by the column wirings 4L and the row wirings 2L.

Referring to the plan view of the pixel 110 shown in FIG. 1A and the cross-sectional view of the pixel 110 shown in FIG. 1B taken along the line A-A', a structure of the pixel 110 will be described. The pixel 110 includes a thin-film transistor 111, a pixel electrode 10, and a capacitor electrode 8.

(Definition of Directions)

In the present embodiment, the direction in which the thin-film transistor 111, the capacitor electrode 8, and the pixel electrode 10 are laminated (vertical direction in FIG. 1B) is referred to as a lamination direction. The side (upper side in FIG. 1B) where components, such as the column wirings 4L or the row wirings 2L, are formed, relative to the insulating substrate 1 is referred to as an upper side. Viewing in the lamination direction is referred to as "in plan view", while viewing in a cross section parallel to the lamination direction is referred to as "in cross-sectional view".

In the pixel 110, the thin-film transistor 111 serves as a switch for selecting the pixel 110. The thin-film transistor 111 includes a gate electrode 2, a source electrode 4, and a drain electrode 5. The thin-film transistor 111 is configured with a semiconductor pattern 6 included between the source electrode 4 and the drain electrode 5. In the thin-film transistor 111, the semiconductor pattern 6 is disposed at a position aligning with the gate electrode 2 via a gate insulating film 3 in the lamination direction.

In the pixel 110, the source electrode 4 of the thin-film transistor 111 is connected to a corresponding column wiring 4L via a source connecting wiring 4C. In the pixel 110, the gate electrode 2 of the thin-film transistor 111 is connected to a corresponding row wiring 2L. In the pixel 110, the drain electrode 5 of the thin-film transistor 111 is connected to a corresponding pixel electrode 10 via a drain connecting wiring 5C and a drain pad 5P. In the pixel 110, a capacitor electrode 8 is connected to a corresponding capacitor wiring 8L.

In the pixel 110, the capacitor electrode 8 is disposed above the thin-film transistor 111 via an interlayer insulating film 7 in the lamination direction. In the pixel 110, the pixel electrode 10 is disposed above the capacitor electrode 8 via a capacitor insulating film 9 in the lamination direction.

In the pixel 110, the pixel electrode 10 includes two electrically conductive layers in the lamination direction, which are a lower layer electrode serving as a lower pixel electrode 10A, and an upper layer electrode serving as an upper pixel electrode 10B. In the pixel electrode 10, an intermediate insulating film 10I is sandwiched between the lower pixel electrode 10A and the upper pixel electrode 10B.

The intermediate insulating film 10I has an opening H1 through which the upper and lower pixel electrodes 10B and 10A are connected to each other. In the pixel 110, the capacitor insulating film 9 and the interlayer insulating film 7 have a drain connecting opening H2 through which the drain pad 5P and the lower pixel electrode 10A are connected to each other.

In the pixel 110, a capacitance (storage capacitance Cs) is configured by an overlap between the capacitor electrode 8 and the lower pixel electrode 10A. In the pixel 110, the column wiring 4L is disposed at a position providing no overlap with the capacitor electrode 8 and the lower pixel electrode 10A, but providing an overlap with the upper pixel electrode 10B, in the lamination direction.

Although the detail will be described later, the thin-film transistor array 100 having such a structure can reduce capacitance between the column wirings 4L and the upper pixel electrodes 10B due to the structure of the pixels 110 as shown in FIGS. 1A and 1B, even more than the capacitance of pixels having a conventional structure. Accordingly, the thin-film transistor array 100 including the pixels 110 with a structure as shown in FIGS. 1A and 1B can reduce power consumption.

A description hereinafter will be given of a difference in capacitance between the pixel 110 and a conventional pixel. The capacitance of the pixel 110 in this case is a capacitance between the column wiring 4L and the upper pixel electrode 10B.

A capacitance Csp between the column wiring 4L and the upper pixel electrode 10B (termed a source-pixel electrode capacitance hereinafter) in the pixel 110 can be expressed by the following Formula (2).

$$Csp = \varepsilon_o S/(Dil/\varepsilon il + Dci/\varepsilon ci + Dmi/\varepsilon mi) \qquad (2)$$

In Formula (2), S is an area of a region where the column wiring 4L overlaps the upper pixel electrode 10B in the lamination direction, Dil is a thickness of the interlayer insulating film 7, εil is a relative permittivity of the interlayer insulating film 7, Dci is a thickness of the capacitor insulating film 9, εci is a relative permittivity of the capacitor insulating film 9, Dmi is a thickness of the intermediate insulating film 10I, and εmi is a relative permittivity of the intermediate insulating film 10I.

Although the detail will be described later, pixels having a conventional structure have a source-pixel electrode capacitance Csp greater than the source-pixel electrode capacitance Csp of the pixel 110 expressed by Formula (2).

Hereinafter, a structure of conventional thin-film transistor arrays will be described to show differences between the source-pixel electrode capacitance Csp of the pixel 110 and the source-pixel electrode capacitance Csp of pixels having a conventional structure.

Figure 18A:
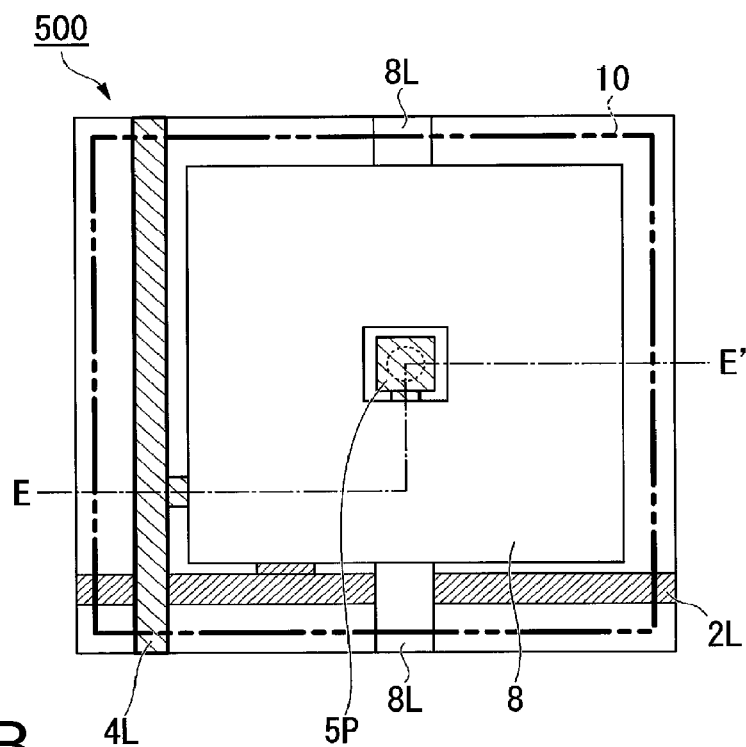
FIG. 18A is a diagram illustrating an example of a structure of a conventional thin-film transistor array.
Figure 18B:
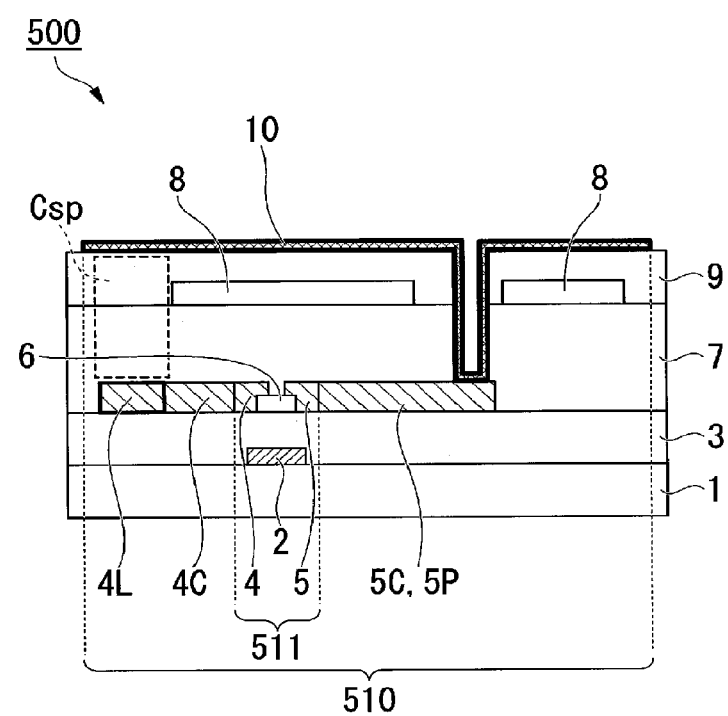
FIG. 18B is a schematic cross-sectional view illustrating a structure taken along the line E-E' of FIG. 18A.

FIGS. 18A and 18B are diagrams illustrating an example of a structure of a conventional thin-film transistor array. FIGS. 18A and 18B schematically show a structure of a conventional thin-film transistor array, as in FIGS. 1A and 1B showing the pixel 110. Hereinafter, the conventional thin-film transistor array is referred to as a thin-film transistor array 500. The thin film transistor array 500 includes conventional pixels each of which is provided with one thin-film transistor. Hereinafter, the thin-film transistor is referred to as a thin-film transistor 511, and each conventional pixel is referred to as a pixel 510.

FIG. 18A is a plan view of a pixel 510 formed in the thin-film transistor array 500. FIG. 18B is a cross-sectional view taken along the line E-E' of the plan view showing the pixel 510. In the plan view of the pixel 510 shown in FIG.

18A, some components (pixel electrode 10) are shown only by contours thereof, as in the plan view of the pixel 110 shown in FIG. 1A. In FIGS. 18A and 18B, like reference signs refer to like components of the pixel 110 shown in FIGS. 1A and 1B and detailed description thereof will be omitted.

As shown in FIG. 18B, the pixel electrode 10 in the conventional pixel 510 has a single layer structure. In the pixel 510, the column wiring 4L is disposed at a position where the column wiring 4L does not overlap the capacitor electrode 8 but overlaps the pixel electrode 10 in the lamination direction. Thus, the source-pixel electrode capacitance Csp of the pixel 510 can be expressed by the following Formula (3) where, similarly to the pixel 110, S is an area of a region where the column wiring 4L overlaps the pixel electrode 10 in the lamination direction of the pixel 510, Dil is a thickness of the interlayer insulating film 7, $\varepsilon il$ is a relative permittivity of the interlayer insulating film 7, Dci is a thickness of the capacitor insulating film 9, and $\varepsilon ci$ is a relative permittivity of the capacitor insulating film 9.

$$Csp = \varepsilon_0 S / (Dil/\varepsilon il + Dci/\varepsilon ci) \quad (3)$$

As will be understood from a comparison between Formulas (2) and (3), Formula (2) includes a relational expression (Dmi/cmi) related to the intermediate insulating film 10I in the denominator on the right-hand side. Accordingly, in the pixel 110, the source-pixel electrode capacitance Csp between the column wiring 4L and the upper pixel electrode 10B becomes smaller than the source-pixel electrode capacitance Csp in the conventional pixel 510. This is because, as shown in FIG. 1B, the configuration of the pixel 110 including two electrically conductive layers, i.e., the lower and upper pixel electrodes 10A and 10B, can increase the distance from the column wiring 4L to the corresponding pixel electrode by a distance corresponding to the thickness of the intermediate insulating film 10I, compared to the single-layer pixel electrode 10 of the conventional pixel 510.

Next, advantageous effects of the source-pixel electrode capacitance Csp being reduced in the pixel 110 will be described. In the following, advantageous effects of the source-pixel electrode capacitance Csp being reduced will be described referring, as appropriate, to FIGS. 18A to 21B showing structures of conventional pixels, each including one thin-film transistor, formed in conventional thin-film transistor arrays.

Figure 19A:
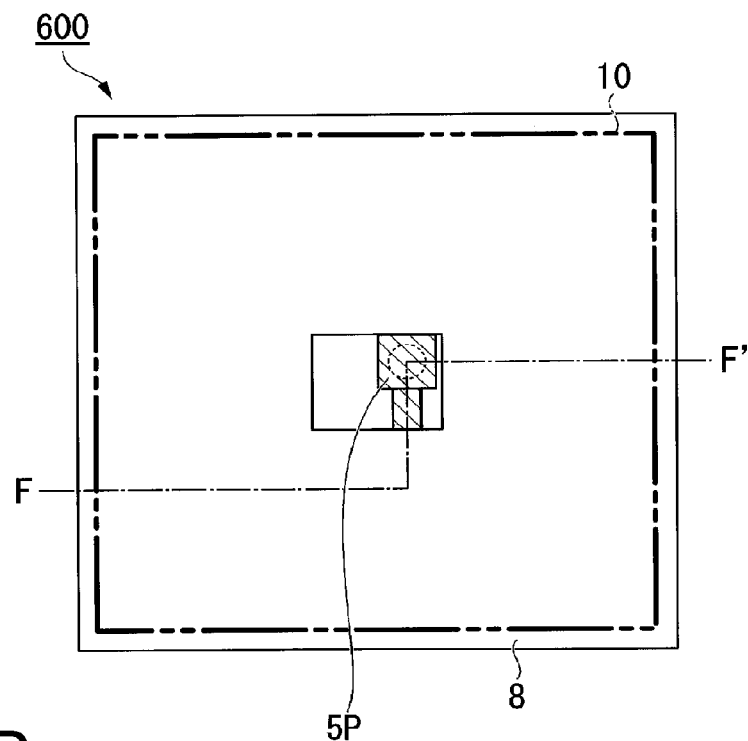
FIG. 19A is a diagram illustrating an example of a structure of a conventional thin-film transistor array.
Figure 19B:
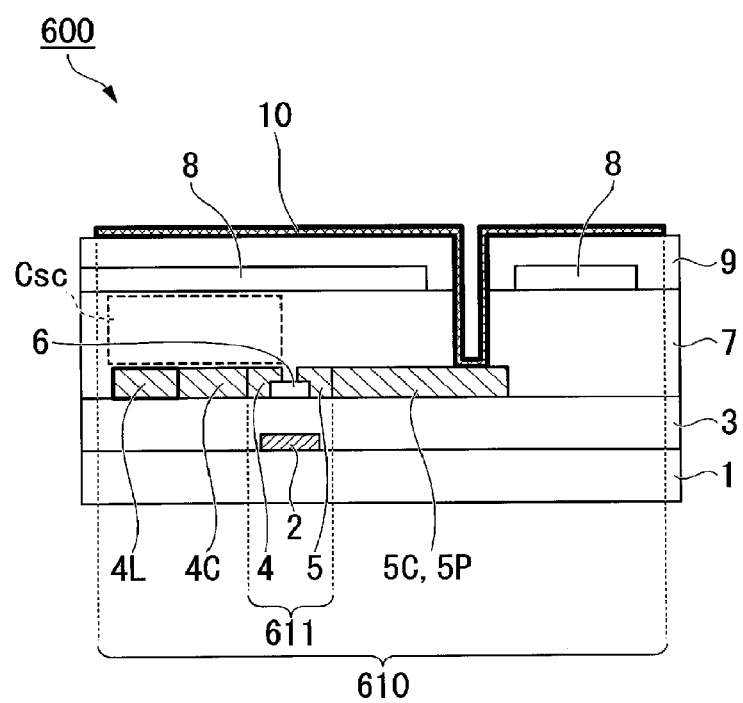
FIG. 19B is a schematic cross-sectional view illustrating a structure taken along the line F-F' of FIG. 19A.

To specify the conventional thin-film transistor arrays and pixels in the following description, the conventional thin-film transistor array shown in FIGS. 19A and 19B is referred to as a thin-film transistor array 600, the pixels disposed in the thin-film transistor array 600 are each referred to as a pixel 610, and the thin-film transistors provided to the respective pixels 610 are each referred to as a thin-film transistor 611.

Figure 20A:
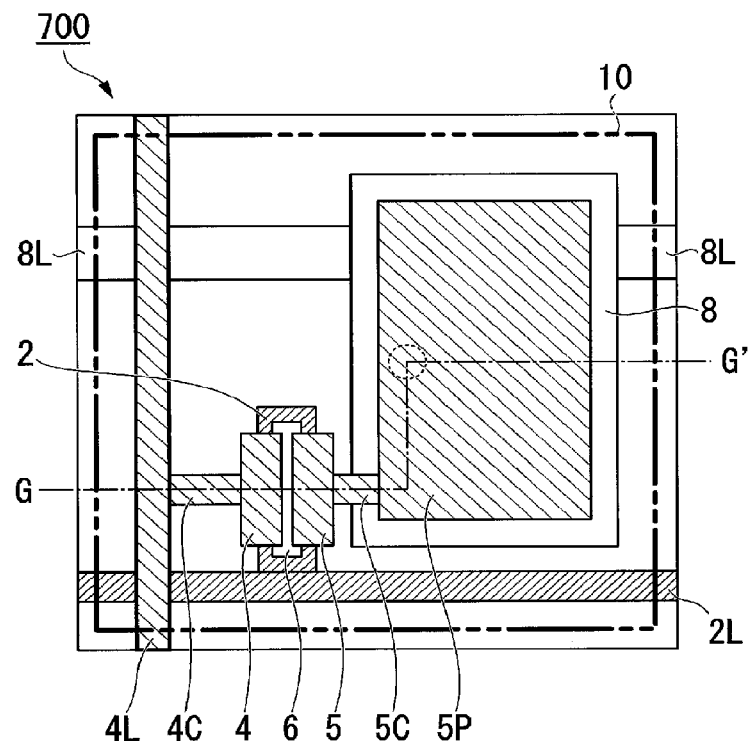
FIG. 20A is a diagram illustrating an example of a structure of a conventional thin-film transistor array.
Figure 20B:
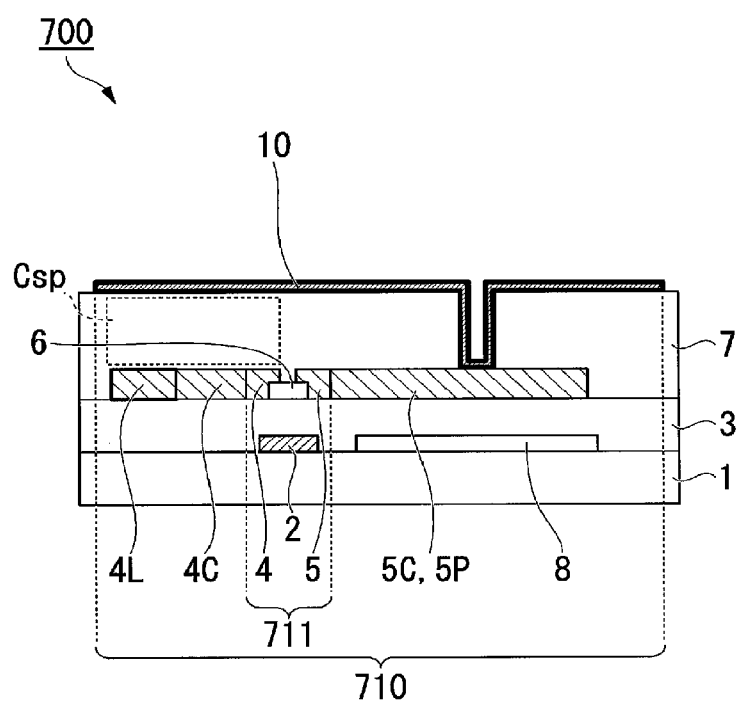
FIG. 20B is a schematic cross-sectional view illustrating a structure taken along the line G-G' of FIG. 20A.

Also, the conventional thin-film transistor array shown in FIGS. 20A and 20B is referred to as a thin-film transistor array 700, the pixels disposed in the thin-film transistor array 700 are each referred to as a pixel 710, and the thin-film transistors provided to the respective pixels 710 are each referred to as a thin-film transistor 711.

Figure 21A:
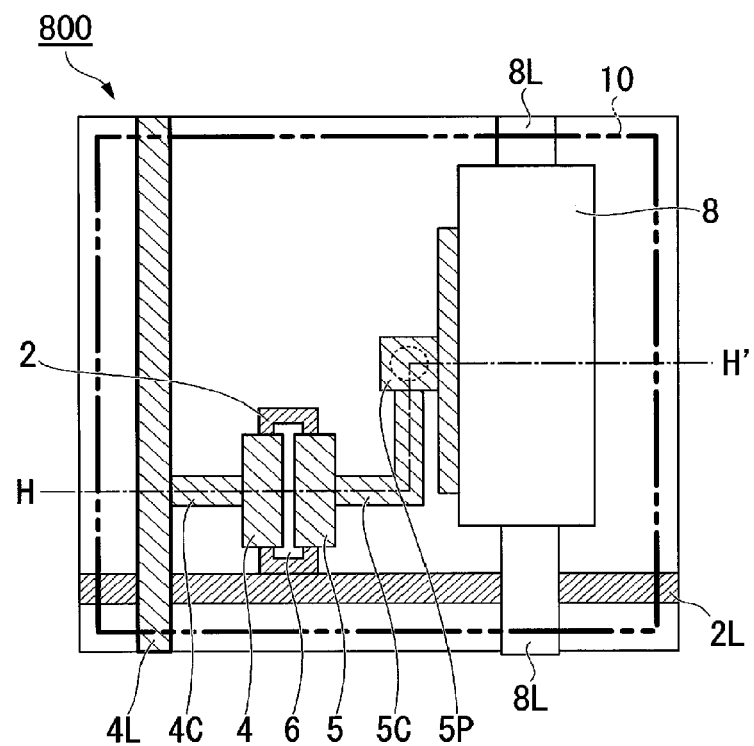
FIG. 21A is a diagram illustrating an example of a structure of a conventional thin-film transistor array.
Figure 21B:
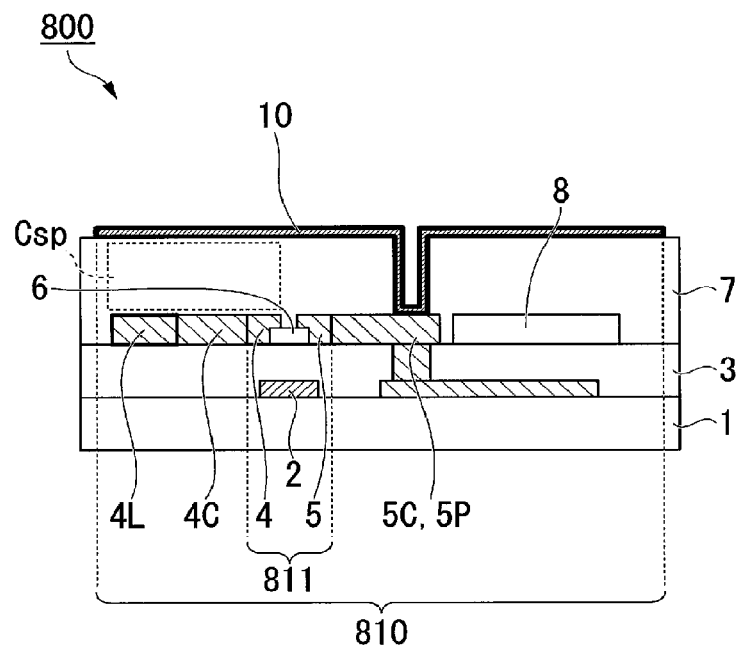
FIG. 21B is a schematic cross-sectional view illustrating a structure taken along the line H-H' of FIG. 21A.

Furthermore, the conventional thin-film transistor array shown in FIGS. 21A and 21B is referred to as a thin-film transistor array 800, the pixels disposed in the thin-film transistor array 800 are each referred to as a pixel 810, and the thin-film transistors provided to the respective pixels 810 are each referred to as a thin-film transistor 811.

FIGS. 19A to 21B also show plan views and cross-sectional views of the respective conventional pixels, as in FIGS. 18A and 18B showing the conventional pixel 510. Specifically, FIG. 19A is a plan view illustrating a pixel 610 formed in the thin-film transistor array 600. FIG. 19B is a cross-sectional view taken along the line F-F' of the plan view showing the pixel 610.

FIG. 20A is a plan view illustrating a pixel 710 formed in the thin-film transistor array 700. FIG. 20B is a cross-sectional view taken along the line G-G' of the plan view showing the pixel 710.

FIG. 21A is a plan view illustrating a pixel 810 formed in the thin-film transistor array 800. FIG. 21B is a cross-sectional view taken along the line H-H' of the plan view showing the pixel 810.

In the plan views of the conventional pixels shown in FIGS. 19A to 21A, some components (pixel electrode 10) are shown only by contours thereof, as in the plan view of the pixel 110 shown in FIG. 1A and the plan view of the pixel 510 shown in FIG. 18A. In FIGS. 19A to 21B, like reference signs refer to like components of the pixel 110 shown in FIGS. 1A and 1B and the pixel 510 shown in FIGS. 18A and 18B and detailed description thereof will be omitted.

As shown in FIGS. 1A and 1B, the pixel 110 is configured by electrodes of four groups, i.e., a gate electrode 2 group, a source electrode 4 group, a drain electrode 5 or pixel electrode 10 group, and a capacitor electrode 8 group. The row wiring 2L connected to the gate electrode 2 can be considered to belong to the gate electrode 2 group, the column wiring 4L connected to the source electrode 4 can be considered to belong to the source electrode 4 group, the pixel electrode 10 connected to the drain electrode 5 can be considered to belong to the drain electrode 5 group, and the capacitor wiring 8L connected to the capacitor electrode 8 cam be considered to belong to the capacitor electrode 8 group.

Accordingly, the number of capacitances between electrodes in the pixel 110 corresponds to the number of combinations of two systems among the four systems, that is, there are six combinations as expressed by $_4C_2=6$. Specifically, there are six capacitances between electrodes in the pixel 110 which are storage capacitance Cs, gate-source capacitance Cgs, source-capacitor capacitance Csc, source-pixel electrode capacitance Csp, gate-capacitor capacitance Cgc, and gate-drain capacitance Cgd.

The storage capacitance Cs is a capacitance between the capacitor electrode 8 and the pixel electrode 10. The gate-source capacitance Cgs is a capacitance between the gate electrode 2 and the source electrode 4. The source-capacitor capacitance Csc is a capacitance between the source electrode 4 and the capacitor electrode 8. The source-pixel electrode capacitance Csp is a capacitance between the source electrode 4 and the pixel electrode 10. The gate-capacitor capacitance Cgc is a capacitance between the gate electrode 2 and the capacitor electrode 8. The gate-drain capacitance Cgd is a capacitance between the gate electrode 2 and the drain electrode 5.

It should be noted that, in ordinary transistors, there is no overlap between the source electrode 4 and the drain electrode 5, and therefore, the source-drain capacitance Csd between the source electrode 4 and the drain electrode 5 is 0. In the structure of the pixel 110 shown in FIG. 1B, the drain electrode 5 is connected to the pixel electrode 10. Therefore, the source-pixel electrode capacitance Csp is parallel to the source-drain capacitance Csd. Accordingly, in the pixel 110, the source-pixel electrode capacitance Csp is considered to additionally include the source-drain capacitance Csd. Similarly, in the pixel 110, the gate-drain capacitance Cgd is parallel to the gate-pixel electrode capacitance Cgp between the gate electrode 2 and the pixel electrode 10. Accordingly, the gate-drain capacitance Cgd is considered to additionally include the gate-pixel electrode capacitance Cgp.

As described above, of the six types of capacitances between the electrodes of the pixel 110, capacitances directly connected to the wiring of the source electrode 4, i.e., the column wiring 4L, include the gate-source capacitance Cgs, the source-capacitor capacitance Csc, and the source-pixel electrode capacitance Csp//storage capacitance Cs. Also, of the six types of capacitances between the electrodes of the pixel 110, wirings of the gate electrode 2, i.e., capacitances directly connected to the row wiring 2L, include the gate-source capacitance Cgs, gate-capacitor capacitance Cgc, and gate-drain capacitance Cgd//storage capacitance Cs.

The symbol // herein refers to a series circuit. Specifically, the relationship between the source-pixel electrode Csp and the storage capacitance Cs in the source-pixel electrode capacitance Csp//storage capacitance Cs can be expressed by the following Formula (4). Also, the relationship between the gate-drain capacitance Cgd and the storage capacitance Cs in the gate-drain capacitance Cgd//storage capacitance Cs can be expressed by the following Formula (5).

$$Csp//Cs=1/(1/Csp+1/Cs) \quad (4)$$

$$Cgd//Cs=1/(1/Cgd+1/Cs) \quad (5)$$

Of the six types of capacitances between the electrodes of the pixel 110, the storage capacitance Cs is designed to be relatively large because of the necessity of retaining a potential in the pixel 110. In this regard, the other five capacitances, i.e., the gate-source capacitance Cgs, the source-capacitor capacitance Csc, the source-pixel electrode capacitance Csp, the gate-capacitor capacitance Cgc, and the gate-drain capacitance Cgd, of the pixel 110 are each designed to have a small capacitance. In the pixel 110, the five capacitances other than the storage capacitance Cs are preferred to be 0. However, in the pixel 110, part of the gate electrode 2 necessarily overlaps part of the source electrode 4 and the drain electrode 5. Therefore, of the five capacitances other than the storage capacitance Cs, the gate-source capacitance Cgs and the gate-drain capacitance Cgd cannot be reduced to 0.

In the thin-film transistor array 100, the column wirings 4L and the row wirings 2L have respective predetermined potentials. Therefore, the column wirings 4L and the row wirings 2L are preferred to be disposed under the pixel electrodes 10. This is because unless the column wirings 4L and the row wirings 2L are covered with the pixel electrodes 10 in plan view, the potential from the column wirings 4L or the row wirings 2L may affect the display presented by the pixels 110. It should be noted that, in plan view, i.e., when the thin-film transistor array 100 is seen perpendicularly to the display surface, the column wirings 4L or the row wirings 2L cannot be hidden behind the pixel electrodes 10 in regions between the pixel electrodes 10. However, since the regions occupied by the column wirings 4L or the row wirings 2L in this case are small compared to the regions occupied by the pixel electrodes 10, the influence of the wirings on the display is negligible.

In a portion where the column wiring 4L or the row wiring 2L overlaps the pixel electrode 10 in plan view in the pixel 110, the source-pixel electrode capacitance Csp is configured by an overlap between the column wiring 4L and the pixel electrode 10, and the gate-pixel electrode capacitance Cgp is configured by an overlap between the row wiring 2L and the pixel electrode 10.

It should be noted that, in conventional pixels, the source-pixel electrode capacitance Csp or the gate-pixel electrode capacitance Cgp can be reduced to 0. Specifically, as in the structure of the conventional pixel 610 shown in FIG. 19B, the column wiring 4L can be entirely covered with the capacitor electrode 8 so that the source-pixel electrode capacitance Csp can be reduced to 0. However, in this configuration, the source-capacitor capacitance Csc becomes large. This is because, in the structure of the conventional electrode 610 shown in FIG. 19B, the insulating film configured by the interlayer insulating film 7 and the capacitor insulating film 9 in the portion forming the source-pixel electrode capacitance Csp in the conventional pixel 510 shown in FIG. 18B has become thinner in FIG. 19B, forming the source-capacitor capacitance Csc only in the interlayer insulating film 7, and thus because the source-capacitor capacitance Csc has been increased more than the amount of reduction of the source-pixel electrode capacitance Csp. For this reason, reducing the source-pixel electrode capacitance Csp (to 0) in the structure of the pixel 610 shown in FIG. 19B does not lead to reducing power consumption in the pixel 610.

As in the structure of the conventional pixel 710 shown in FIG. 20A where the capacitor wiring 8L is parallel to the row wiring 2L, the region in which the row wiring 2L overlaps the capacitor wiring 8L in plan view can be eliminated to reduce the gate-capacitor capacitance Cgc to 0. However, in this configuration, the source-pixel electrode capacitance Csp cannot be reduced to 0.

As in the structure of the conventional pixel 810 shown in FIG. 21A where the capacitor wiring 8L is parallel to the column wiring 4L in plan view, the region in which the column wiring 4L overlaps the capacitor wiring 8L in plan view can be eliminated. Thus, the source-capacitor capacitance Csc can be reduced to 0. However, in this configuration, the gate-capacitor capacitance Cgc cannot be reduced to 0.

Of the five types of capacitances, i.e., the gate-source capacitance Cgs, the source-capacitor capacitance Csc, the source-pixel electrode capacitance Csp, the gate-capacitor capacitance Cgc, and the gate-drain capacitance Cgd, non-zero capacitances have approximately the same orders of magnitude therebetween which are two or three orders of magnitude smaller than the storage capacitance Cs.

A description will be given herein of electrical energy (power consumption) consumed by the non-zero capacitances, assuming the number of the column wirings 4L in the thin-film transistor array 100 to be M (M is a positive integer), and the number of the row wirings 2L to be N (N is a positive integer).

Figure 2:
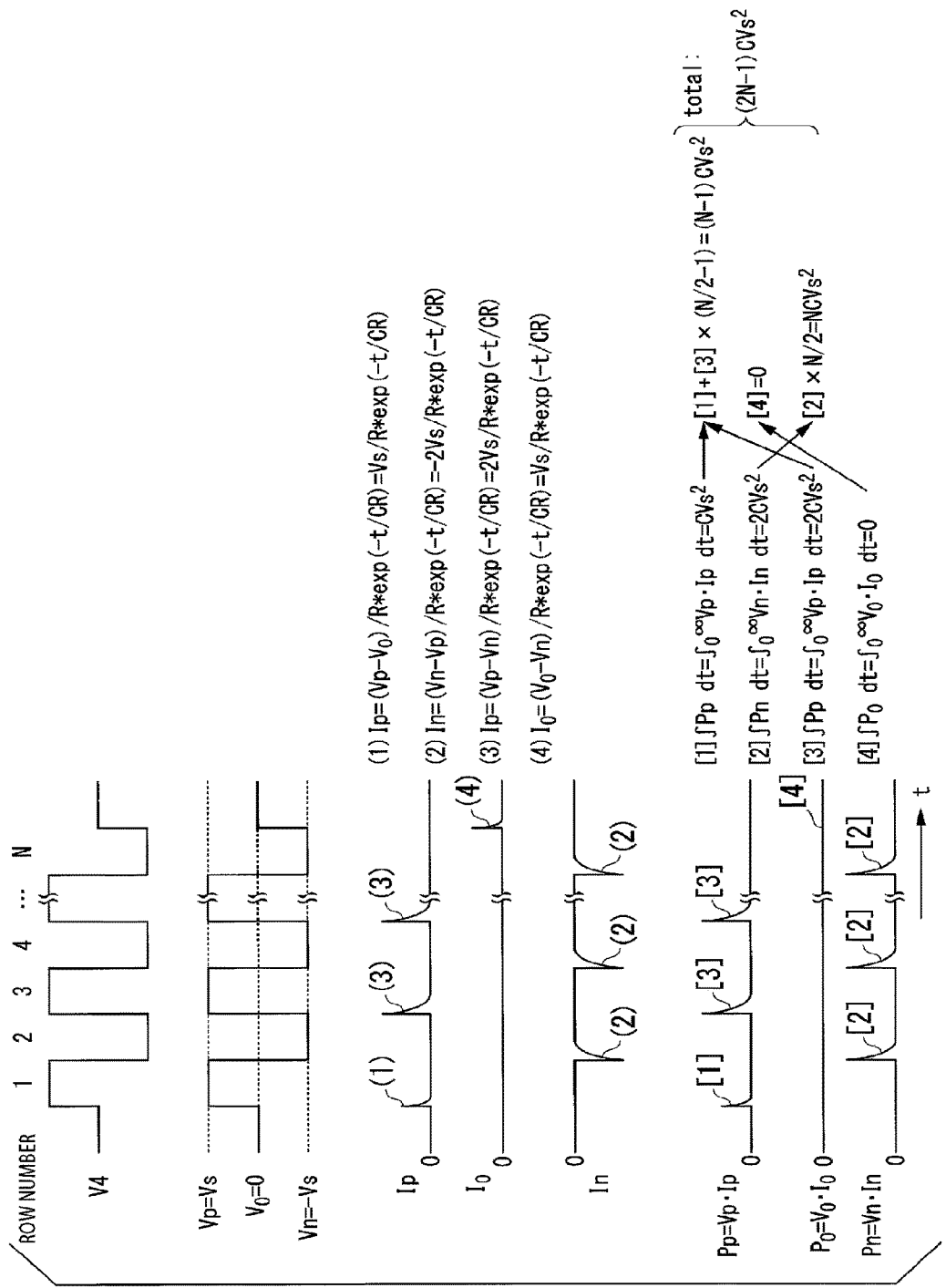
FIG. 2 is a diagram illustrating an example of calculating electrical energy in the thin-film transistor array according to the first embodiment.
Figure 3:
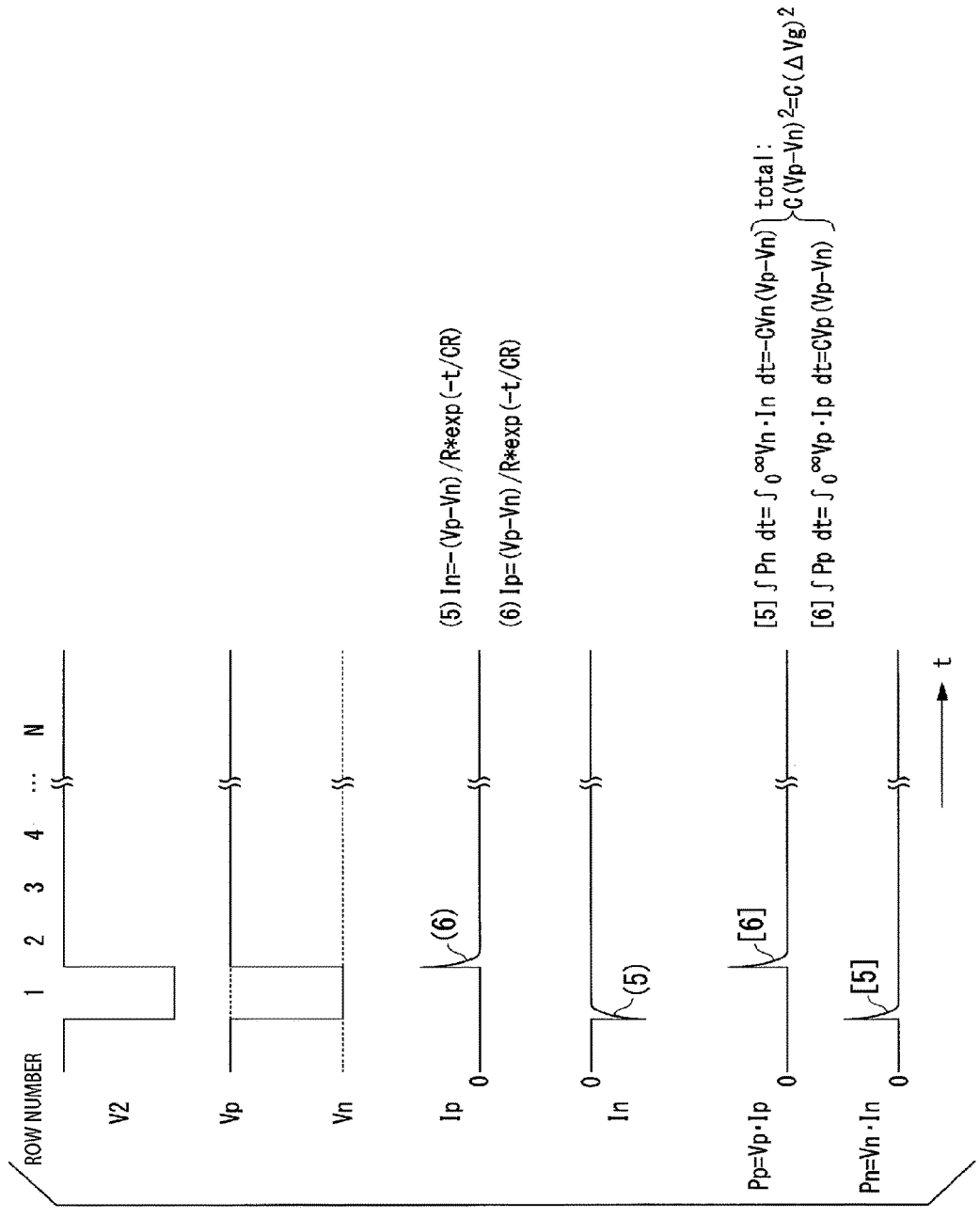
FIG. 3 is a diagram illustrating an example of calculating electrical energy in the thin-film transistor array according to the first embodiment.
Figure 4:
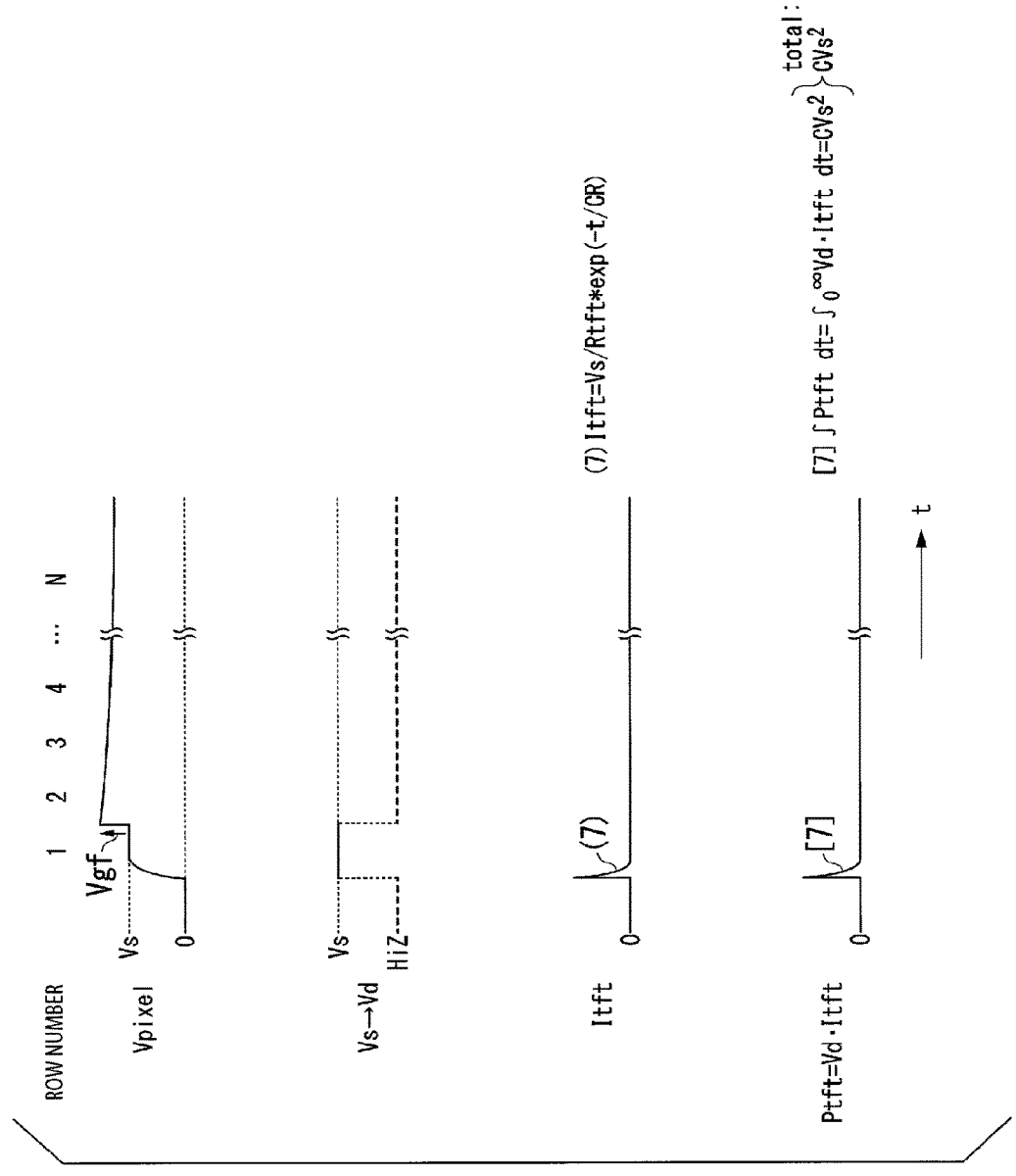
FIG. 4 is a diagram illustrating an example of calculating electrical energy in the thin-film transistor array according to the first embodiment.

FIGS. 2 to 4 are diagrams each illustrating an example of calculating electrical energy in the thin-film transistor array 100 according to the first embodiment. FIG. 2 shows an example of calculating electrical energy consumed per frame by capacitances connected to any of the column wirings 4L in the thin-film transistor array 100. FIG. 3 shows an example of calculating electrical energy consumed per frame by capacitances connected to any of the row wirings 2L in the thin-film transistor array 100. FIG. 4 shows an example of calculating electrical energy supplied from the thin-film transistors 111 per frame when charging the storage capacitances via the thin-film transistors 111.

First, referring to FIG. 2, an example of calculating electrical energy consumed per frame by capacitances connected to any of the column wirings 4L in the thin-film transistor array 100 will be described. In the thin-film transistor array 100, N gate-source capacitances Cgs, N source-capacitor capacitances Csc, and N source-pixel electrode capacitances Csp are connected to any one of the column wirings 4L. The total of these capacitances (termed capacitance C hereinafter) can be expressed by the following Formula (6).

$$C=N(Cgs+Csc+Csp//Cs) \qquad (6)$$

In the thin-film transistor array 100, voltages of the column wirings 4L are changed according to the individual row data. Therefore, conditions in which the capacitance C connected to the column wirings 4L is maximally charged and discharged in the thin-film transistor array 100 are the conditions where reverse polarity voltages are written into individual rows. In the following description, voltages of white writing and black writing into the pixels 110 are expressed as ±Vs and resistance of the column wirings 4L is expressed as R. It should be noted that, strictly, the resistance R of the column wirings 4L is the sum of a column wiring resistance and an output resistance of a drive circuit driving the thin-film transistor array 100. Hereinafter, the resistance R of the column wirings 4L is referred to as a column wiring resistance, and the drive circuit driving the column wirings 4L of the thin-film transistor array 100 is referred to as a source driver.

FIG. 2 shows, with the horizontal axis as time t, the voltage waveform of voltage V4 of the source electrodes 4, the relation to power supply of the source driver, current waveform Ip of positive power supply outputted from the source driver, current waveform In of negative power supply, and current waveform $I_0$ of ground (GND) line. FIG. 2 also shows the power consumption waveform Pp of the positive power supply, power consumption waveform Pn of the negative power supply, and power consumption waveform $P_0$ of the GND line. In FIG. 2, the voltage Vp of the positive power supply is indicated by Vp=+Vs, the voltage Vn of the negative power supply is indicated by Vn=−Vs, and the voltage $V_0$ of the GND line is indicated by $V_0$=0. Accordingly, in FIG. 2, the power consumption Pp of the positive power supply is Pp=VpIp, the power consumption Pn of negative power supply is Pn=VnIn, and the power consumption $P_0$ of the GND line is $P_0=V_0I_0$. Also, FIG. 2 shows formulas for respective positions where current waveform and power waveform change. In FIG. 2, each charging waveform is integrated over the range time t=0 to ∞, to simplify the formula for calculating electrical energy. Practically, time constant may only have to be sufficiently larger than CR. For example, even the charging waveform integrated over the range time t=0 to 3CR can cover 95% of the electrical energy, and thus can be approximately considered to be equivalent to time t=0 to ∞.

The electrical energy P consumed by one column wiring 4L per frame is expressed by the following Formula (7).

$$P=(2N-1)C(Vs)^2 \qquad (7)$$

Accordingly, the electrical energy P consumed by M column wirings 4L per frame is expressed by the following Formula (8).

$$P = M \times (2N - 1) \times N(Cgs + Csc + Csp//Cs) \times (Vs)^2 \qquad (8)$$
$$= MN(2N - 1)(Cgs + Csc + Csp//Cs)(Vs)^2$$

Thus, if the number N of row wirings 2L is sufficiently larger than 1, the electrical energy P consumed by the column wirings 4L per frame is assumed to be expressed by the following Formula (9).

$$P=2MN^2(Cgs+Csc+Csp//Cs)(Vs)^2 \qquad (9)$$

The electrical energy P consumed in the thin-film transistor array 100 is minimized when the voltages of the column wirings 4L remain unchanged. In this case, the electrical energy P consumed per frame in the thin-film transistor array 100 is P=0.

Next, referring to FIG. 3, an example of calculating electrical energy consumed per frame by capacitances connected to any of the row wirings 2L in the thin-film transistor array 100 will be described. In the thin-film transistor array 100, M gate-source capacitances Cgs, M gate-capacitor capacitances Cgc, and M gate-drain capacitances Cgc are connected to any one of the row wirings 2L. A capacitance C can be expressed by the following Formula (10).

$$C=M(Cgs+Cgc+Cgd//Cs) \qquad (10)$$

In the thin-film transistor array 100, the individual row wirings 2L, when selected, change voltage so that the state of the thin-film transistors 111 change in the order of off→on→off. Therefore, in the thin-film transistor array 100, the frequency of charges and discharges of the capacitance C connected to the row wirings 2L does not depend on an image, but is equal to the frequency of voltage changes, i.e., two times per frame.

The following description will be given taking a voltage variation of the row wirings 2L to be a gate potential variation ΔVg. Also, the following description will be given taking the positive voltage of the gate electrodes 2 of the thin-film transistors 111 to be Vp, negative voltage thereof to be Vn, and resistance of the row wirings 2L to be R. It should be noted that, strictly, the resistance R of the row wirings 2L is the sum of a row wiring resistance and an output resistance of a drive circuit driving the thin-film transistor array 100. Hereinafter, the resistance R of the row wirings 2L is referred to as a row wiring resistance, and the drive circuit driving the row wirings 2L of the thin-film transistor array 100 is referred to as a gate driver.

The calculation example shown in FIG. 3 is for the case where the thin-film transistors 111 are p-channel transistors. If the thin-film transistors 111 are n-channel transistors, the voltage sign is reversed but the electrical energy calculated is the same. Therefore, a calculation example for the case where the thin-film transistors 111 are n-channel transistors is omitted.

FIG. 3 shows, with the horizontal axis as time t, the voltage waveform of voltage V2 of the gate electrodes 2, relation to power supply of the gate driver, current waveform Ip of positive power supply outputted from the gate driver, and current waveform In of the negative power supply. FIG. 3 also shows power consumption waveform Pp of the positive power supply and power consumption waveform Pn of the negative power supply. In FIG. 3, power consumption Pp of positive power supply is Pp=VpIp and power consumption Pn of negative power supply is Pn=VnIn. Also, FIG. 3 shows formulas for respective positions where current waveform and power waveform change. In FIG. 3, as in FIG. 2, each charging waveform is integrated over the range time t=0 to ∞, to simplify the formula for calculating electrical energy. Practically, in FIG. 3, as in FIG. 2, the time constant may only have to be sufficiently larger than CR. For example, even the charging waveform integrated over the range time t=0 to 3CR can cover 95% of the electrical energy, and thus can be approximately considered to be equivalent to time t=0 to ∞.

The electrical energy P consumed by one row wiring 2L per frame is expressed by the following Formula (11).

$$P=C(\Delta Vg)^2 \quad (11)$$

Accordingly, the electrical energy P consumed by N row wirings 2L per frame is expressed by the following Formula (12).

$$P = N \times M(Cgs + Cgc + Cgd//Cs) \times (\Delta Vg)^2 \quad (12)$$
$$= NM(Cgs + Cgc + Cgd//Cs)(\Delta Vg)^2$$

Next, referring to FIG. 4, an example is shown of calculating electrical energy consumed per frame when charging capacitances via the thin-film transistors 111. In the thin-film transistor array 100, the number of pixels 110 is equal to the number expressed by: the number of column wirings 4L×the number of row wirings 2L, i.e., equal to MN. In each pixel 110, the capacitance charged when the thin-film transistor 111 is on corresponds to the storage capacitance Cs and the gate-drain capacitance Cgd. Thus, the capacitance C can be express by the following Formula (13).

$$C=Cs+Cgd \quad (13)$$

It should be noted that, strictly, a display medium capacitance Cp per region of pixel 110 (per pixel area) in the display medium layer of the thin-film transistor array 100 is also added to the capacitance C. However, in the case of electronic paper, the display medium capacitance Cp is extremely smaller than the storage capacitance Cs. Therefore, the following description will be given omitting the display medium capacitance Cp.

Usually, the storage capacitance Cs is large, while the gate-drain capacitance Cgd is small in a pixel 110. In the thin-film transistor array 100, the capacitance C is maximally charged when displays of all the pixels 110 are changed. The following description will be given, taking variation of the voltage in the column wirings 4L to be Vs and resistance of the thin-film transistors 111 to be R. It should be noted that, strictly, the resistance R of the thin-film transistors 111 is the sum of thin-film transistor resistance, resistance of the column wirings 4L (column wiring resistance), and the like. Hereinafter, the resistance R of the thin-film transistors 111 is referred to as a thin-film transistor resistance.

FIG. 4 shows pixel voltage Vpixel, voltage Vd, and current waveform Itft, with the horizontal axis as time t. The pixel voltage Vpixel indicates a voltage waveform of the pixel voltage Vpixel of the pixels 110 in the case where the pixels 110 belongs to a first row. The voltage Vd is a voltage applied to the drain electrodes 5 from the source electrodes 4 when data is written into the pixels 110. In other words, the thin-film transistors 111 are turned on to apply Vs only when the first row is selected, and are turned off, i.e., have high impedance (HiZ), when another row is selected. The current waveform Itft indicates a waveform of the current flowing from the source electrodes 4 of the thin-film transistors 111 to the drain electrodes 5 thereof.

Also, FIG. 4 shows a power consumption waveform Ptft when charging the storage capacitances from the thin-film transistors 111 when data is written into the pixels 110. In FIG. 4, the power consumption Ptft is expressed as Ptft=VdItft. FIG. 4 shows formulas for respective positions where current waveform and power waveform change. In FIG. 4, as in FIGS. 2 and 3, each charging waveform integrated over the range time t=0 to ∞, to simplify the formula for calculating electrical energy. Practically, in FIG. 4, as in FIGS. 2 and 3, the time constant may only have to be sufficiently larger than CR. For example, even the charging waveform integrated over the range time t=0 to 3CR can cover 95% of the electrical energy, and thus can be approximately considered to be equivalent to time t=0 to ∞.

The electrical energy P consumed by one thin-film transistor 111 per frame is expressed by the following Formula (14).

$$P=(Cs+Cgd)(Vs)^2 \quad (14)$$

The electrical energy P consumed by all the pixels 110 (MN pixels) per frame is expressed by the following Formula (15).

$$P=MN(Cs+Cgd)(Vs)^2 \quad (15)$$

It should be noted that, in the thin-film transistor array 100, the electrical energy P when a drain voltage Vd=Vs is written is equal to the electrical energy P when a drain voltage Vd=−Vs is written. Accordingly, power consumption in the thin-film transistors 111 is equal between black writing and white writing. The electrical energy P consumed in the thin-film transistors 111 is minimized when potentials of the pixel electrodes 10 (pixel potential) remain unchanged. In this case, the electrical energy P consumed per frame in the thin-film transistors 111 is P=0.

Herein, the three types of power consumption described referring to FIGS. 2 and 3 will be compared in terms of magnitude. First, the electrical energy consumed by the column wirings 4L described referring to FIG. 2 will be compared with the electrical energy consumed by the row wirings 2L described referring to FIG. 3.

The maximum electrical energy consumed by the column wirings 4L per frame in the thin-film transistor array 100 corresponds to electrical energy P expressed by the above Formula (9) and thus is proportional to $MN^2$ if the number N of row wirings 2L is sufficiently greater than 1. Also, the electrical energy consumed by the row wirings 2L per frame in the thin-film transistor array 100 corresponds to the electrical energy P expressed by the above Formula (12) and thus is proportional to MN.

The orders of magnitude are approximately the same between the right-hand side (Cgs+Csc+Csp//Cs) of Formula (9) and the right-hand side (Cgs+Cgc+Cgd//Cs) of Formula (12). Furthermore, the orders of magnitude are approximately the same between Vs on the right-hand side of Formula (9) and ΔVg on the right-hand side of Formula (12). Usually, the number N of row wirings 2L in the thin-film transistor array 100 is several tens to several hundreds. Therefore, in the thin-film transistor array 100, the maximum power consumption of the column wirings 4L due to voltage variation is one or two orders of magnitude greater than the power consumption of the row wirings 2L due to voltage variation.

Next, the electrical energy consumed by the column wirings 4L described referring to FIG. 2 will be compared with the maximum electrical energy consumed by the thin-film transistors 111 described referring to FIG. 4.

As described above, the maximum electrical energy consumed by the column wirings 4L per frame in the thin-film transistor array 100 corresponds to electrical energy P expressed by the above Formula (9) and thus is proportional to $MN^2$ if the number N of row wirings 2L is sufficiently greater than 1. Also, the maximum electrical energy consumed by the thin-film transistors 111 per frame corresponds to the electrical energy P expressed by the above Formula (15) and thus is proportional to MN.

When the orders of magnitude are compared between the right-hand side (Cgs+Csc+Csp//Cs) of Formula (9) and the right-hand side (Cs+Cgd) of Formula (15), the latter is one or two orders of magnitude greater than the former. In the thin-film transistor array 100, the number N of row wirings 2L is several tens to several hundreds.

Accordingly, in the thin-film transistor array 100, the maximum power consumption per frame of the thin-film transistors 111 is slightly smaller than or substantially equal to the maximum power consumption per frame of the column wirings 4L due to voltage variation.

However, in electronic paper, often one image is written in a plurality of frames. For example, when an image of a horizontal stripe pattern (horizontal stripe) is written in a plurality of frames, the electrical energy P for the column wirings 4L expressed by Formula (9) may be consumed by the frames while the image is written. However, in this case, the electrical energy P for the thin-film transistors 111 expressed by Formula (15) is consumed only by an initial frame (first frame) at the start of writing the image, and is not consumed by the following frames (second and the subsequent frames) in which the same voltage is written. Accordingly, if an image is written in several frames or several tens of frames as in electronic paper, power consumption of the column wirings 4L is greater than that of the thin-film transistors when the entire image writing is concerned.

For this reason, in the thin-film transistor array 100, the maximum power consumption of the column wirings 4L is the greatest among the three types of power consumption, and the value is expressed by the above Formula (8).

The pixel 110 shown in FIG. 1 and the conventional pixel 510 shown in FIG. 18 have capacitor electrodes 8 whose shapes in plan view are the same. In each of these pixels, the gate-source capacitance Cgs, source-capacitor capacitance Csc, and storage capacitance Cs are equal to each other. Thus, as described above, the maximum power consumption becomes smaller in the pixel 110 having a smaller source-pixel electrode capacitance Csp, than in the conventional pixel 510 having a larger source-pixel electrode capacitance Csp.

A description will now be given of a method of producing (production steps for) the pixels 110 including the thin-film transistors 111. FIGS. 5A to 10B are schematic diagrams illustrating a method of producing (production steps for) the thin-film transistor array 100 according to the first embodiment of the present invention. FIGS. 5A to 10B each schematically show the structure of a pixel 110 in each step of producing the pixel 110 shown in FIGS. 1A and 1B. Specifically, FIGS. 5A, 6A, 7A, 8A, 9A and 10A show, as in FIG. 1A, schematic plan views of the structure of a pixel 110 in respective production steps, while FIGS. 5B, 6B, 7B, 8B, 9B and 10B show schematic cross-sectional views of the structure taken along the line A-A' of the plan view of the pixel 110 shown in FIG. 1A in respective production steps.

(Step 11)

Figure 5A:
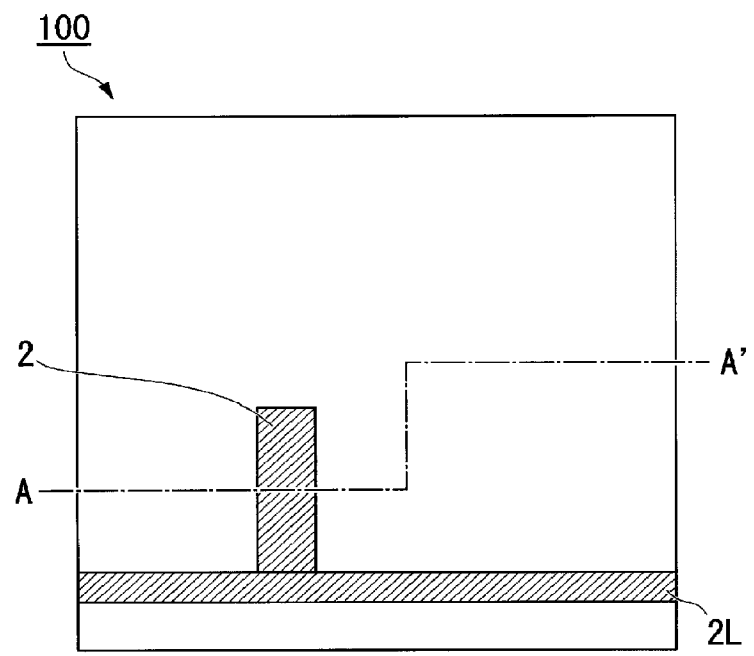
FIG. 5A is a schematic diagram illustrating a method of producing the thin-film transistor array according to the first embodiment.
Figure 5B:
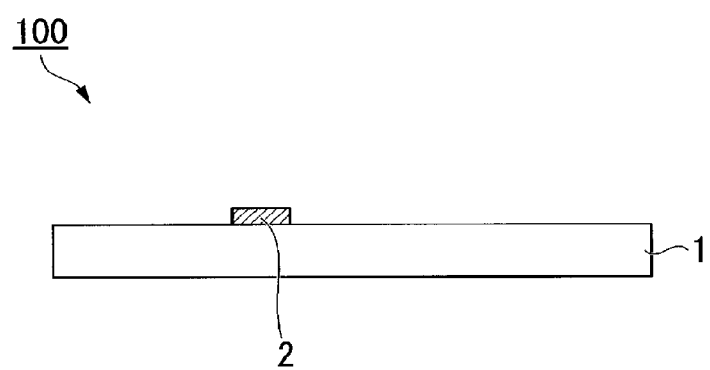
FIG. 5B is a schematic cross-sectional view illustrating a structure taken along the line A-A' of FIG. 5A.

As shown in FIGS. 5A and 5B, row wirings 2L and gate electrodes 2 are formed on an insulating substrate 1. The row wirings 2L are formed to extend in a row direction (lateral direction) on the insulating substrate 1.

Materials used for the insulating substrate 1 may include inorganic materials such as glass, and organic materials such as polyethylene terephthalate (PET), polyethylene naphthalate (PEN), polyether sulfone (PES), polycarbonate, polyimide (PI), polyether imide (PEI), polystyrene (PS), polyvinyl chloride (PVC), polyethylene (PE), polypropylene (PP), nylon (Ny), and epoxy. Materials used for the row wirings 2L and the gate electrodes 2 may include a metal such as aluminum (Al), silver (Ag), copper (Cu), chromium (Cr), nickel (Ni), molybdenum (Mo), gold (Au), platinum (Pt), and niobium (Nb); and electrically conductive oxides such as tin-doped indium oxide (ITO).

The method of preparing the row wirings 2L or the electrodes 2 may be a method in which a material mentioned above for the gate electrodes 2 or the row wirings 2L is formed into a film by sputtering or the like over the entire surface of the insulating substrate 1, followed by photolithography, etching, and resist stripping.

(Step 12)

Figure 6A:
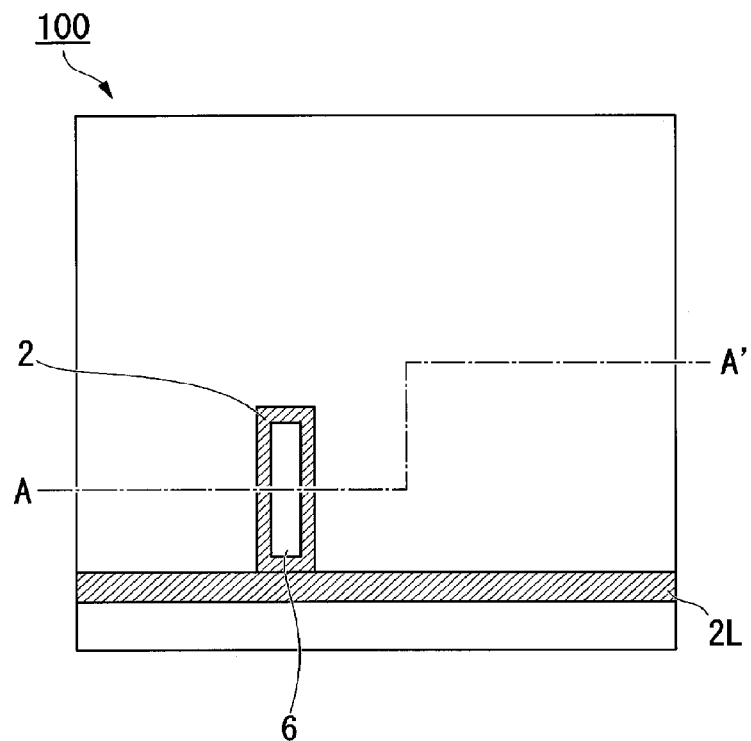
FIG. 6A is a schematic diagram illustrating a method of producing the thin-film transistor array according to the first embodiment.
Figure 6B:
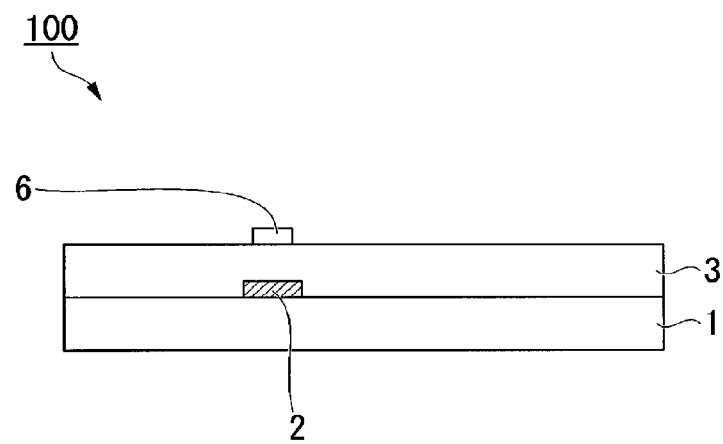
FIG. 6B is a schematic cross-sectional view illustrating a structure taken along the line A-A' of FIG. 6A.

As shown in FIGS. 6A and 6B, a gate insulating film 3 is formed on the insulating substrate 1, the gate electrodes 2, and the row wirings 2L. On this laminate, semiconductor patterns 6 are further formed so as to overlap with the respective gate electrodes 2 in the lamination direction.

Materials used for the gate insulating film 3 may be inorganic materials such as silicon dioxide ($SiO_2$), silicon oxynitride (SiON), and silicon nitride (SiN). The method of preparing the gate insulating film 3 may be a vacuum film forming method such as sputtering and chemical vapor deposition (CVD).

Materials used for the semiconductor patterns 6 may include inorganic semiconductors such as amorphous silicon (a-Si) and polysilicon (poly-Si); and oxide semiconductors such as indium oxide ($In_2O_3$), gallium oxide ($Ga_2O_3$), zinc oxide (ZnO), tin oxide ($SnO_2$), indium-gallium-zinc oxide (InGaZnO), indium-gallium-tin oxide (InGaSnO), and indium-tin-zinc oxide (InSnZnO).

The method of preparing the semiconductor pattern 6 may be a method in which a film of a semiconductor layer for the semiconductor pattern 6 is formed by plasma CVD on the gate insulating film 3 as formed, using a material mentioned above, followed by photolithography, etching, and resist stripping.

In step 12, a contact layer, not shown, may be provided on the semiconductor patterns. Alternatively, in step 12, an etching stopper layer, not shown, may be formed on the semiconductor layer without forming (patterning) the semiconductor layer, and this etching stopper layer may be patterned. Then, after forming source electrodes 4 and drain electrodes 5 in step 13 described below (see FIGS. 7A and 7B), the semiconductor layer not covered with the etching stopper layer, the source electrodes 4, and the drain electrodes 5 may be etched away to provide semiconductor patterns 6.

(Step 13)

Figure 7A:
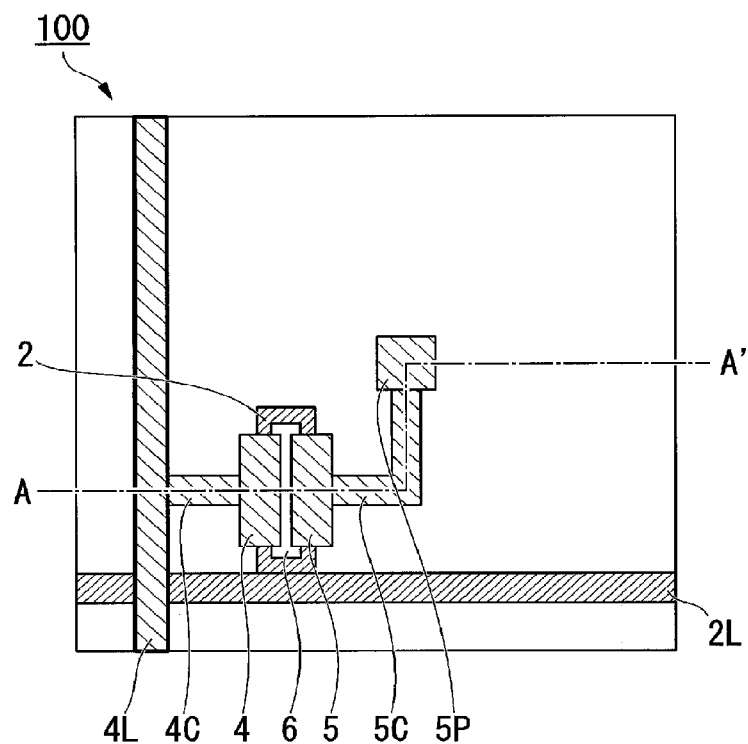
FIG. 7A is a schematic diagram illustrating a method of producing the thin-film transistor array according to the first embodiment.
Figure 7B:
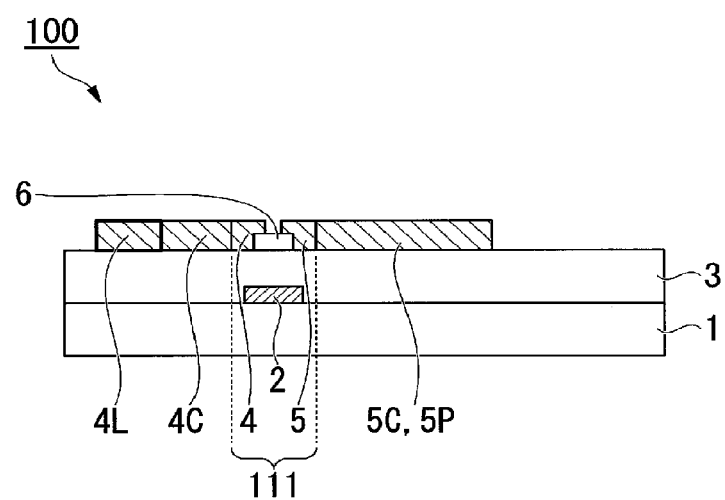
FIG. 7B is a schematic cross-sectional view illustrating a structure taken along the line A-A' of FIG. 7A.

As shown in FIGS. 7A and 7B, column wirings 4L, source connecting wirings 4C, source electrodes 4, drain electrodes 5, drain connecting wirings 5C, and drain pads 5P are formed on the gate insulating film 3 and the semiconductor patterns 6. In this case, the source electrodes 4 and the drain electrodes 5 are formed so as to be in contact with the respective semiconductor patterns 6.

Materials used for the column wirings 4L, the source connecting wirings 4C, the source electrodes 4, the drain electrodes 5, the drain connecting wirings 5C, and the drain pads 5P may include, similarly to the gate electrodes 2 and the row wirings 2L formed in step 11, metal such as aluminum (Al), silver (Ag), copper (Cu), chromium (Cr), nickel (Ni), molybdenum (Mo), gold (Au), platinum (Pt), and niobium (Nb); and electrically conductive oxides such as tin-doped indium oxide (ITO).

The method of preparing the column wirings 4L, the source connecting wirings 4C, the source electrodes 4, the drain electrodes 5, the drain connecting wirings 5C, and the drain pads 5P may be a method in which a film for the column wirings 4L is formed using a material mentioned above by sputtering or the like across the surfaces of the gate insulating film 3 and the semiconductor patterns 6 formed in step 12, followed by photolithography, etching, and resist stripping.

In step 12, if a contact layer, not shown, has been provided on the semiconductor patterns, the contact layer between the source electrodes 4 and the drain electrodes 5 may be removed in step 13.

(Step 14)

Figure 8A:
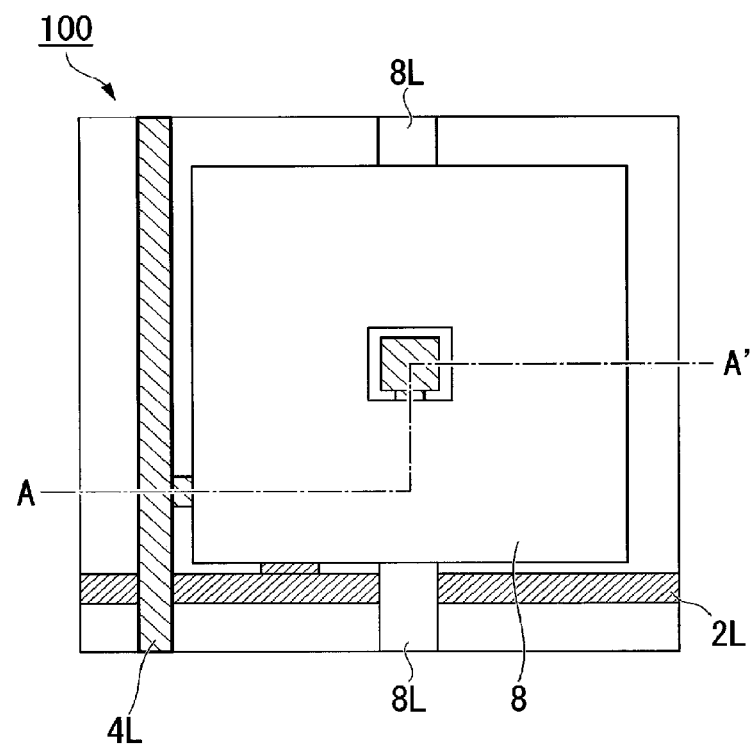
FIG. 8A is a schematic diagram illustrating a method of producing the thin-film transistor array according to the first embodiment.
Figure 8B:
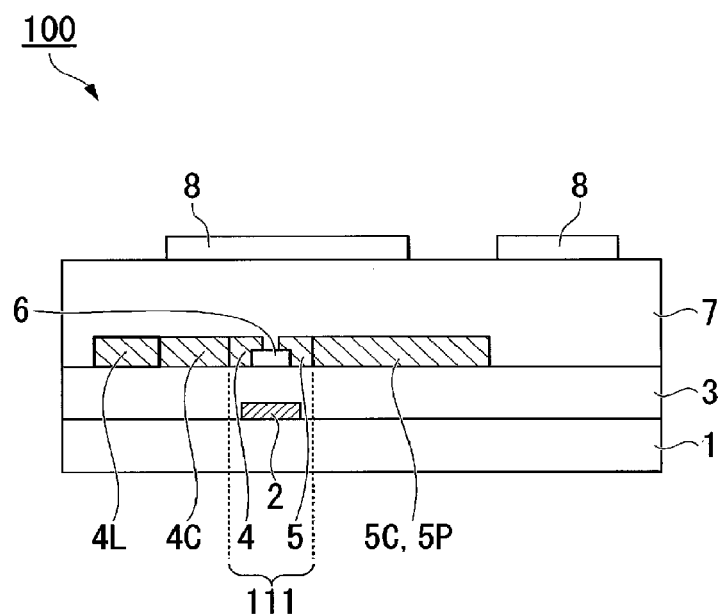
FIG. 8B is a schematic cross-sectional view illustrating a structure taken along the line A-A' of FIG. 8A.

As shown in FIGS. 8A and 8B, an interlayer insulating film 7 is formed on the gate insulating film 3, the source electrodes 4, the drain electrodes 5, and the like. Furthermore, capacitor electrodes 8 and capacitor wirings 8L are formed on the interlayer insulating film 7.

Materials used for the interlayer insulating film 7 may be inorganic materials such as silicon dioxide ($SiO_2$), silicon oxynitride (SiON), and silicon nitride (SiN), similarly to the gate insulating film 3 formed in step 12.

The method of preparing the interlayer insulating film 7 may be a vacuum film forming method such as sputtering and chemical vapor deposition (CVD), similarly to the gate insulating film 3 formed in step 12.

Materials used for the capacitor electrodes 8 and the capacitor wirings 8L may include a metal such as aluminum (Al), silver (Ag), copper (Cu), chromium (Cr), nickel (Ni), molybdenum (Mo), gold (Au), platinum (Pt), and niobium (Nb); and electrically conductive oxides such as tin-doped indium oxide (ITO), similarly to the gate electrodes 2 or the row wirings 2L formed in step 11, or the source electrodes 4, the drain electrodes 5, or the like formed in step S12.

The method of preparing the capacitor electrodes 8 and capacitor wirings 8L may be a method in which a material mentioned above for the capacitor electrodes 8 and the capacitor wirings 8L is formed into a film by sputtering or the like over the entire surface of the interlayer insulating film 7 as formed, followed by photolithography, etching, and resist stripping.

(Step 15)

Figure 9A:
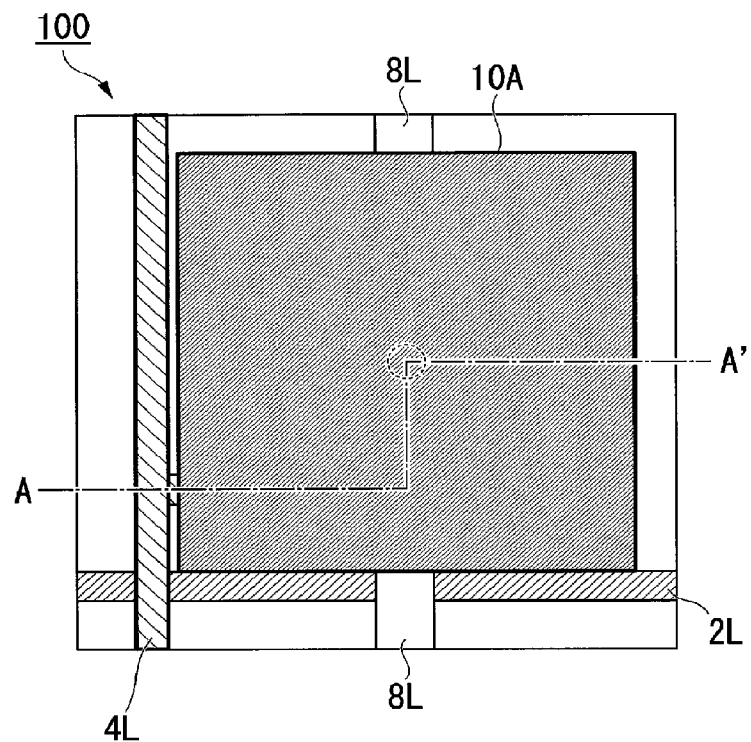
FIG. 9A is a schematic diagram illustrating a method of producing the thin-film transistor array according to the first embodiment.
Figure 9B:
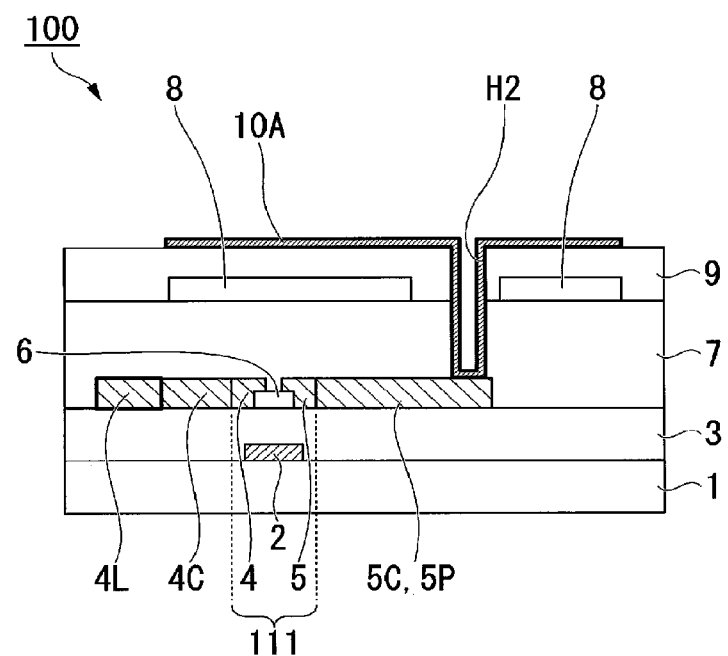
FIG. 9B is a schematic cross-sectional view illustrating a structure taken along the line A-A' of FIG. 9A.

As shown in FIGS. 9A and 9B, a capacitor insulating film 9 is formed on the interlayer insulating film 7, the capacitor electrodes 8, and the capacitor wirings 8L, and then lower pixel electrodes 10A are further formed. In this case, recesses are formed in the capacitor insulating film 9 and the interlayer insulating film 7 at positions above the respective drain pads 5P, and lower electrodes 10A are formed so as to contact the respective drain pads 5P in these recesses. Specifically, the lower pixel electrodes 10A are formed so as to be in contact with the drain pads 5P via respective drain connecting openings H2 formed through the capacitor insulating film 9 and interlayer insulating film 7.

Materials used for the capacitor insulating film 9 may be inorganic materials such as silicon dioxide ($SiO_2$), silicon oxynitride (SiON), and silicon nitride (SiN), similarly to the gate insulating film 3 formed in step 12 or the interlayer insulating film 7 formed in step 14.

The method of preparing the capacitor insulating film 9 may be a vacuum film forming method such as sputtering and chemical vapor deposition (CVD), similarly to the gate insulating film 3 formed in step 12 or the interlayer insulating film 7 formed in step 14. As a method of forming recesses in the capacitor insulating film 9 and the interlayer insulating film 7, photolithography, dry etching, and resist stripping may be preferred.

Materials used for the lower pixel electrodes 10A may include a metal such as aluminum (Al), silver (Ag), copper (Cu), chromium (Cr), nickel (Ni), molybdenum (Mo), gold (Au), platinum (Pt), and niobium (Nb); and electrically conductive oxides such as tin-doped indium oxide (ITO), similarly to the electrodes or wirings formed in steps 11, 13 and 14.

The method of preparing the lower pixel electrodes 10A may be a method in which a material mentioned above for the lower pixel electrodes 10A is formed into a film by sputtering or the like over the entire surface, followed by photolithography, etching, and resist stripping, similarly to the method of forming the electrodes or wirings in steps 11, 13 and 14.

(Step 16)

Figure 10A:
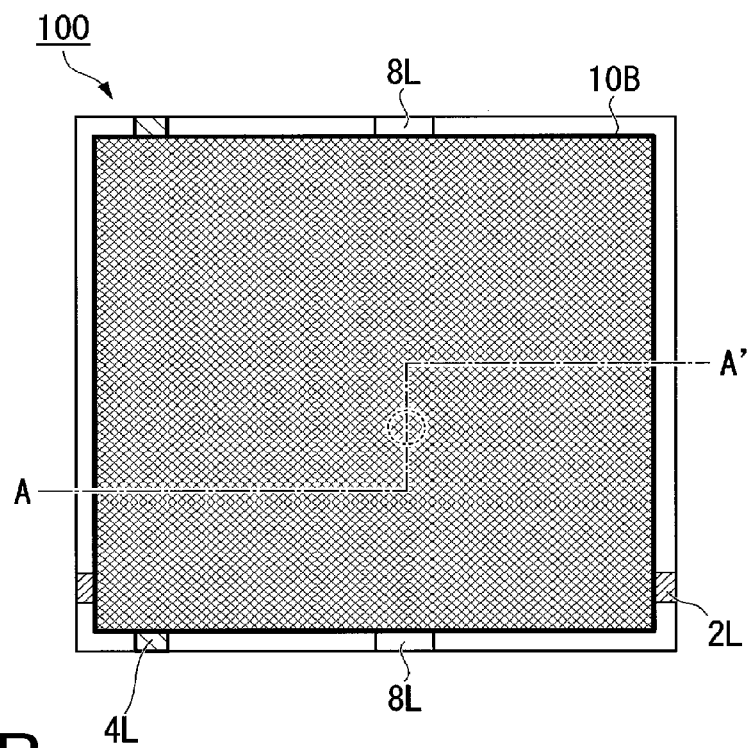
FIG. 10A is a schematic diagram illustrating a method of producing the thin-film transistor array according to the first embodiment.
Figure 10B:
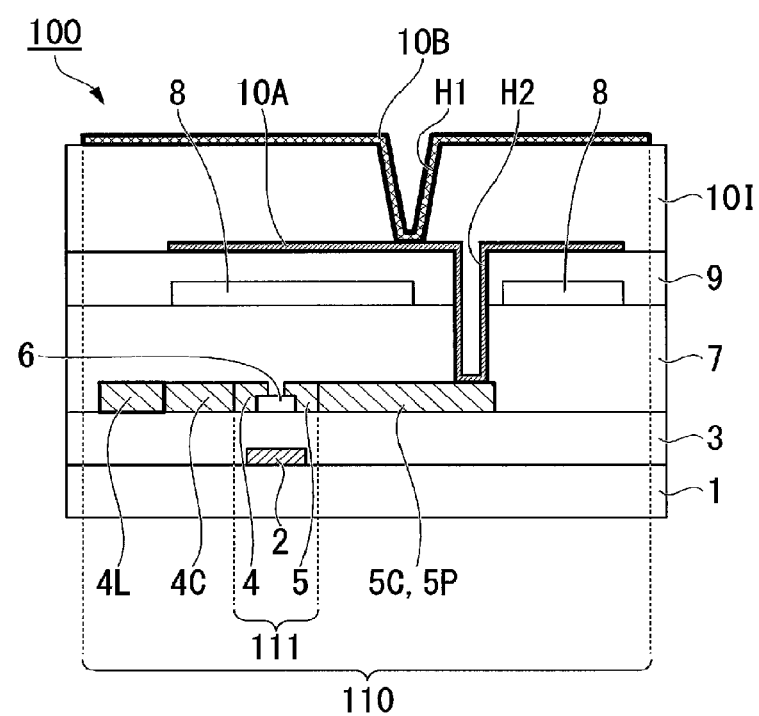
FIG. 10B is a schematic cross-sectional view illustrating a structure taken along the line A-A' of FIG. 10A.

As shown in FIGS. 10A and 10B, an intermediate insulating film 10I is formed on the capacitor insulating film 9 and the lower pixel electrodes 10A. The intermediate insulating film 10I is provided with openings H1 in portions thereof. Furthermore, upper pixel electrodes 10B are formed on the intermediate insulating film 10I. In this case, the upper pixel electrodes 10B are formed so as to be connected to the respective lower pixel electrodes 10A via the intermediate insulating film 10I at positions of the openings H1 of the intermediate insulating film 10I.

As a material for the intermediate insulating film 10I, a photosensitive resin may be used. The method of preparing the intermediate insulating film 10I is preferred to be a method in which a photosensitive resin is exposed and developed, and formed into a shape having openings H1.

Materials used for the upper pixel electrodes 10B may include a metal such as aluminum (Al), silver (Ag), copper (Cu), chromium (Cr), nickel (Ni), molybdenum (Mo), gold (Au), platinum (Pt), and niobium (Nb); and electrically conductive oxides such as tin-doped indium oxide (ITO), similarly to the electrodes or wirings formed in steps 11, 13, 14 and 15.

The method of preparing the upper pixel electrodes 10B may be a method in which a material mentioned above for the upper pixel electrodes 10B is formed into a film by sputtering or the like over the entire surface, followed by photolithography, etching, and resist stripping, similarly to the electrodes or wirings formed in steps 11, 13, 14 and 15.

Through these steps, a thin-film transistor array 100 is produced, including a plurality of pixels 110 arranged in a matrix with respective thin-film transistors 111 provided therein. Specifically, in the thin-film transistor array 100, a plurality of pixels 110 are arranged in a matrix in which each pixel 110 includes a pixel electrode 10 configured by two electrically conductive layers, i.e., the lower pixel electrode 10A and the upper pixel electrode 10B. Thus, the thin-film transistor array 100 can reduce power consumption when rewriting the display, even more than the thin-film transistor array 500, for example, in which a plurality of pixels 510 having a conventional structure are arranged in a matrix.

As described above, in the thin-film transistor array 100 of the first embodiment, the pixel electrodes 10 provided to the respective pixels 110 arranged in a matrix are each configured by two electrically conductive layers, i.e., the lower pixel electrode 10A and the upper pixel electrode 10B. Thus, the thin-film transistor array 100 according to the first embodiment can reduce capacitance between the column wiring 4L and the upper pixel electrode 10B configured in each pixel 110, to less than the capacitance between the column wiring 4L and the conventional single-layer pixel electrode 10 configured in each conventional pixel 510. Accordingly, a display device using the thin-film transistor array 100 according to the first embodiment can achieve low power consumption.

The thin-film transistor array 100 according to the first embodiment has been described assuming the case of forming pixels 110 each including, as shown in FIGS. 1A, 1B and 5A to 10B, a thin-film transistor 111 having a top contact structure in which a source electrode 4 and a drain electrode 5 are provided on a semiconductor pattern 6. However, the structure of the thin-film transistor 111 provided to each pixel 110 in the thin-film transistor array 100 is not limited to the thin-film transistor having a top contact structure. For example, the thin-film transistor 111 may have a structure in which a semiconductor pattern 6 is provided on a source electrode 4 and a drain electrode 5, i.e., may have a bottom contact structure.

Second Embodiment

Figure 11A:
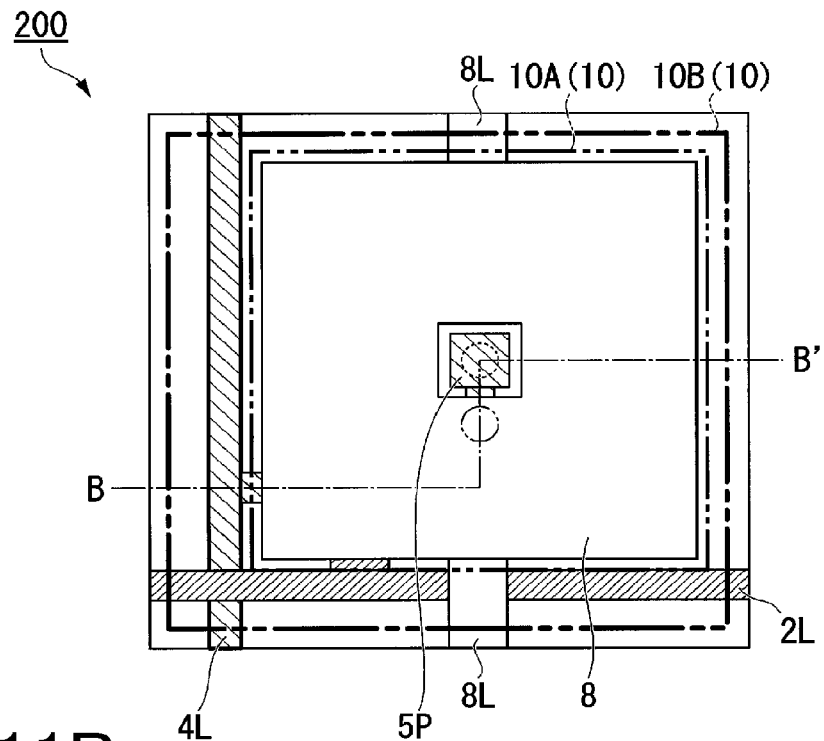
FIG. 11A is a diagram illustrating an example of a structure of a thin-film transistor array according to a second embodiment.
Figure 11B:
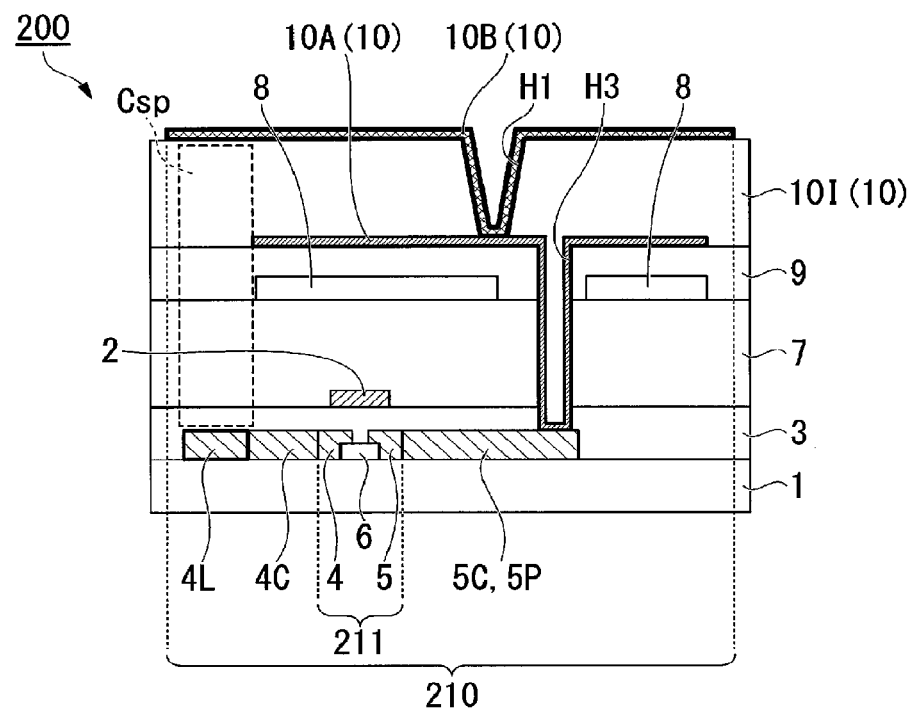
FIG. 11B is a schematic cross-sectional view illustrating a structure taken along the line B-B' of FIG. 11A.

Next, a second embodiment of the present invention will be described. FIGS. 11A and 11B are diagrams illustrating an example of a structure of a thin-film transistor array according to a second embodiment of the present invention. FIGS. 11A and 11B schematically show a structure of a thin-film transistor array according to the second embodiment, as in FIGS. 1A and 1B showing the thin-film transistor array 100 according to the first embodiment. The thin-film transistor array according to the second embodiment is referred to as a thin-film transistor array 200 hereinafter. The thin film transistor array 200 includes pixels each of which is provided with one thin-film transistor. Hereinafter, the thin-film transistor is referred to as a thin-film transistor 211, and each pixel is referred to as a pixel 210. Specifically, FIG. 11A is a schematic plan view showing a structure of a pixel 210 formed in the thin-film transistor array 200. FIG. 1B is a schematic cross-sectional view taken along the line B-B' of the plan view of the pixel 210 shown in FIG. 11A. In the plan view of the pixel 210 shown in FIG. 11A, some components (lower pixel electrode 10A and upper pixel electrode 10B) are shown only by contours thereof for ease of understanding the positions of the components formed in lower layers, as in the plan view of a pixel 110 disposed in the thin-film transistor array 100 of the first embodiment shown in FIG. 1A.

It should be noted that components of the thin-film transistor array 200 and the pixels 210 of the second embodiment shown in FIG. 11A include components common to those of the thin-film transistor array 100 and the pixels 110 of the first embodiment. Accordingly, like reference signs of the components of the thin-film transistor array 200 and the pixels 210 according to the second embodiment refer to like components of the thin-film transistor array 100 and the pixels 110 according to the first embodiment and detailed description thereof will be omitted.

The thin-film transistor array 200 is also formed on an insulating substrate 1, similarly to the thin-film transistor array 100 of the first embodiment. In the thin-film transistor array 200, a plurality of column wirings 4L are disposed so as to extend in the column (longitudinal) direction, and a plurality of row wirings 2L are disposed so as to extend in the row (lateral) direction perpendicular to the column wirings 4L. At positions where the column wirings 4L intersect the row wirings 2L in the thin-film transistor array 200, a plurality of respective pixels 210 are disposed. Specifically, the pixels 210 are arranged in a matrix along the column wirings 4L and the row wirings 2L. More specifically, in the thin-film transistor array 200, the pixels 210 are disposed in regions which are defined in a matrix by the column wirings 4L and the row wirings 2L. The thin-film transistor array 200 has a configuration similar to the thin-film transistor array 100 of the first embodiment.

Referring to the plan view of the pixel 210 shown in FIG. 11A and the cross-sectional view taken along the line B-B' of the pixel 210 shown in FIG. 11B, a structure of the pixel 210 will be described. The pixel 210 is configured to include a thin-film transistor 211, a pixel electrode 10, and a capacitor electrode 8, similarly to the pixel 110 disposed in the thin-film transistor array 100 according to the first embodiment.

In the pixel 210, as in the pixel 110, the thin-film transistor 211 serves as a switch for selecting the pixel 210. The thin-film transistor 211 includes a gate electrode 2, a source electrode 4, and a drain electrode 5, similarly to the thin-film transistor 111 of the first embodiment. The thin-film transistor 211 is configured with a semiconductor pattern 6 included between the source electrode 4 and the drain electrode 5 in the lamination direction, similarly to the thin-film transistor 111 of the first embodiment. In the thin-film transistor 211, the semiconductor pattern 6 is disposed at a position aligning with the gate electrode 2 via a gate insulating film 3, similarly to the semiconductor pattern 6 in the thin-film transistor 111 of the first embodiment.

However, the thin-film transistor 211 provided to each of the pixels 210 in the thin-film transistor array 200 is different in structure from the thin-film transistor 111 provided to each of the pixels 110 in the thin-film transistor array 100 according to the first embodiment. Specifically, the thin-film transistor 111 provided to the pixel 110, and the thin-film transistor 211 provided to the pixel 210 are different from each other in positional relationship of the gate electrode 2 with the source electrode 4 and the drain electrode 5 (the former and the latter are reversely disposed in the lamination direction) More specifically, in the thin-film transistor 111 provided to the pixel 110, the gate electrode 2 is formed on the insulating substrate 1, while the source electrode 4 and the drain electrode 5 are formed on the gate insulating film 3. In contrast, in the thin-film transistor 211 provided to the pixel 210, the source electrode 4 and the drain electrode 5 are formed on the insulating substrate 1, while the gate electrode 2 is formed on the gate insulating film 3. Furthermore, in the pixel 210, the lower pixel electrodes 10A are formed so as to be connected to the respective drain pads 5P via drain connecting openings H3 formed in the capacitor insulating film 9, the interlayer insulating film 7, and the gate insulating film 3.

In the pixel 210, the source electrode 4 of the thin-film transistor 211 is connected, as in the pixel 110, to a corresponding column wiring 4L via a source connecting wiring 4C. In the pixel 210, as in the pixel 110, the gate electrode 2 of the thin-film transistor 211 is connected to a corresponding row wiring 2L. In the pixel 210, the drain electrode 5 of the thin-film transistor 211 is connected, as in the pixel 110, to a corresponding pixel electrode 10 via a drain connecting wiring 5C and a drain pad 5P. In the pixel 210, as in the pixel 110, the capacitor electrode 8 is connected to a corresponding capacitor wiring 8L.

In the pixel 210, as in the pixel 110, the capacitor electrode 8 is disposed above the thin-film transistor 211 via an interlayer insulating film 7 in the lamination direction. In the pixel 210, as in the pixel 110, the pixel electrode 10 is disposed above the capacitor electrode 8 via a capacitor insulating film 9 in the lamination direction.

In the pixel 210, as in the pixel 110, the pixel electrode 10 is configured by two electrically conductive layers disposed in the lamination direction, which are a lower layer electrode serving as a lower pixel electrode 10A, and an upper layer electrode serving as an upper pixel electrode 10B. In the pixel electrode 10, an intermediate insulating film 10I is sandwiched between the lower pixel electrode 10A and the upper pixel electrode 10B, as in the pixel electrode 10 configuring the pixel 110. The intermediate insulating film 10I has an opening H1 through which the upper and lower pixel electrodes 10B and 10A are connected to each other. In the pixel 210, as in the pixel 110, a capacitance is configured by an overlap between the capacitor electrode 8 and the lower pixel electrode 10A. In the pixel 210, as in the pixel 110, the column wiring 4L is disposed at a position providing no overlap with the capacitor electrode 8 and the lower pixel electrode 10A, but providing an overlap with the upper pixel electrode 10B, in the lamination direction.

Similarly to the thin-film transistor array 100 of the first embodiment, the thin-film transistor array 200 having such a structure can reduce capacitance between the column wiring 4L and the upper pixel electrode 10B using the structure of the pixel 210 shown in FIGS. 11A and 11B, compared to the capacitance of a pixel having a conventional configuration. Thus, the thin-film transistor array 200 including the pixels 210 with a structure shown in FIGS. 11A and 11B can reduce electrical energy consumed, similarly to the thin-film transistor array 100 including the pixels 110 with a structure shown in FIGS. 1A and 1B.

A description hereinafter will be given of a difference in capacitance between the pixel 210 and a conventional pixel. The capacitance of the pixel 210 in this case is a capacitance between the column wiring 4L and the upper pixel electrode 10B.

A source-pixel electrode capacitance Csp between the column wiring 4L and the upper pixel electrode 10B in the pixel 210 can be expressed by the following Formula (16).

$$Csp = \varepsilon_0 S/(Dgi/\varepsilon gi + Dil/\varepsilon il + Dci/\varepsilon ci + Dmi/\varepsilon mi) \quad (16)$$

In Formula (16), S is an area of a region where the column wiring 4L overlaps the upper pixel electrode 10B in the lamination direction, Dgi is a thickness of the gate insulating film 3, $\varepsilon gi$ is a relative permittivity of the gate insulating film 3, Dil is a thickness of the interlayer insulating film 7, $\varepsilon il$ is a relative permittivity of the interlayer insulating film 7, Dci is a thickness of the capacitor insulating film 9, $\varepsilon ci$ is a relative permittivity of the capacitor insulating film 9, Dmi is a thickness of the intermediate insulating film 10I, and $\varepsilon mi$ is a relative permittivity of the intermediate insulating film 10I.

Pixels having a conventional structure have a source-pixel electrode capacitance Csp greater than the source-pixel electrode capacitance Csp of the pixel 210 expressed by Formula (16).

Hereinafter, a structure of conventional thin-film transistor arrays will be described to show differences between the source-pixel electrode capacitance Csp of the pixel 210 and the source-pixel electrode capacitance Csp of pixels having a conventional structure.

Figure 22A:
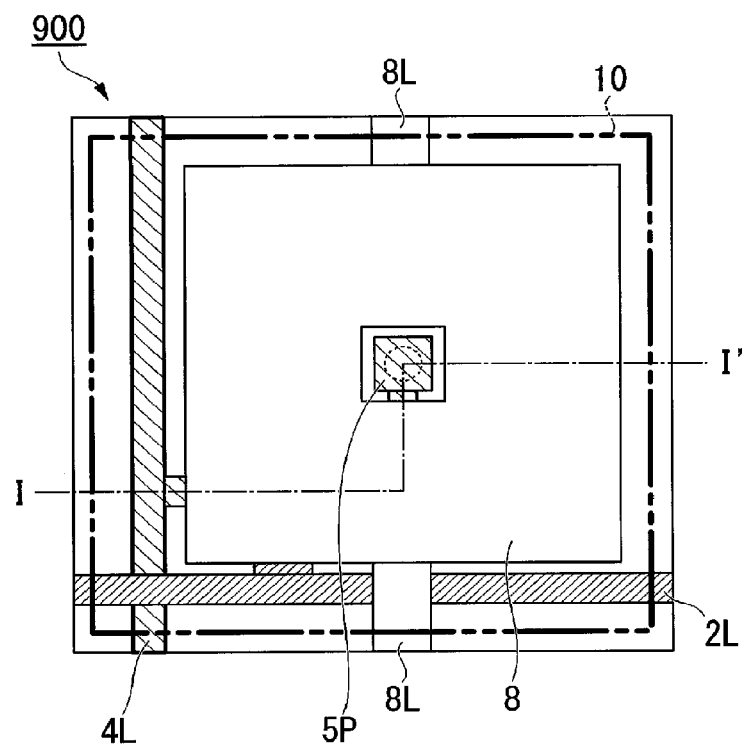
FIG. 22A is a diagram illustrating an example of a structure of a conventional thin-film transistor array.
Figure 22B:
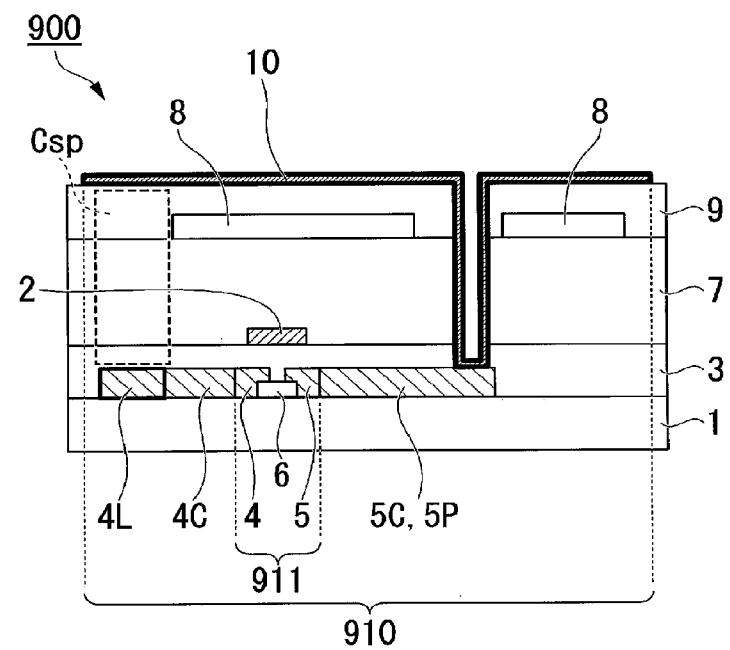
FIG. 22B is a schematic cross-sectional view illustrating a structure taken along the line I-I' of FIG. 22A.

FIGS. 22A and 22B are diagrams illustrating an example of a structure of a conventional thin-film transistor array. FIGS. 22A and 22B schematically show a structure of a conventional thin-film transistor array, as in FIGS. 11A and 11B showing the pixel 210. Hereinafter, the conventional thin-film transistor array is referred to as a thin-film transistor array 900. The thin-film transistor array 900 includes conventional pixels each of which is provided with one thin-film transistor. Hereinafter, this thin-film transistor is referred to as a thin-film transistor 911, and each conventional pixel is referred to as a pixel 910.

FIG. 22A is a plan view of a pixel 910 formed in the thin-film transistor array 900. FIG. 22B is a cross-sectional view taken along the line I-I' of the plan view showing the pixel 910. In the plan view of the pixel 910 shown in FIG. 22A, as in the plan view of the pixel 210 shown in FIG. 11A, some components (pixel electrode 10) are shown only by contours thereof. In FIGS. 22A and 22B, like reference signs refer to like components of the pixel 210 shown in FIGS. 11A and 11B and detailed description thereof will be omitted.

The structure of the thin-film transistor 911 provided to the conventional pixel 910 shown in FIGS. 22A and 22B is the same as the structure of the thin-film transistor 211 provided to the pixel 210 shown in FIGS. 11A and 11B. The thin-film transistor 911 provided to the conventional pixel 910 shown in FIGS. 22A and 22B is different (reversely structured) from the conventional pixel 510 shown in FIGS. 18A and 18B in positional relationship between the gate electrode 2, the source electrode 4, and the drain electrode 5, similarly to the reversed positional relationship of the gate electrode 2, the source electrode 4, and the drain electrode 5, between the thin-film transistor 111 provided to the pixel 110 and the thin-film transistor 211 provided to the pixel 210.

As shown in FIG. 22B, the pixel electrode 10 in the conventional pixel 910 also has a single layer structure. In the pixel 910, the column wiring 4L is disposed so as not to overlap the capacitor electrode 8, but to overlap the pixel electrode 10 in the lamination direction. Thus, the source-pixel electrode capacitance Csp of the pixel 910 can be expressed by the following Formula (17) where, similarly to the pixel 210, S is an area of a region where the column wiring 4L overlaps the pixel electrode 10 in the lamination direction of the pixel 910, Dgi is a thickness of the gate insulating film 3, $\varepsilon gi$ is a relative permittivity of the gate insulating film 3, Dil is a thickness of the interlayer insulating film 7, $\varepsilon il$ is a relative permittivity of the interlayer insulating film 7, Dci is a thickness of the capacitor insulating film 9, and $\varepsilon ci$ is a relative permittivity of the capacitor insulating film 9.

$$Csp = \varepsilon_0 S/(Dgi/\varepsilon gi + Dil/\varepsilon il + Dci/\varepsilon ci) \quad (17)$$

As will be understood from a comparison between Formulas (16) and (17), Formula (16) includes, similarly to the pixel 110, a relational expression (Dmi/cmi) related to the intermediate insulating film 10I in the denominator on the right-hand side. Accordingly, in the pixel 210, as in the pixel 110, the source-pixel electrode capacitance Csp between the column wiring 4L and the upper pixel electrode 10B becomes smaller than the source-pixel electrode capacitance Csp of the conventional pixel 910. This is because, as shown in FIG. 11B, the pixel 210 including the pixel electrode 10 with a configuration as in the pixel 110 can increase the distance from the column wiring 4L to the pixel electrode by a distance corresponding to the thickness of the intermediate insulating film 10I, compared to the single-layer pixel electrode 10 of the conventional pixel 910.

Thus, the pixel 210 can also achieve an advantageous effect, as the pixel 110 does, of reducing the maximum power consumption compared to the conventional pixel 910.

It should be noted that the advantageous effect achieved by reducing the source-pixel electrode capacitance Csp in the pixel 210 may be considered to be similar to the advantageous effect achieved by reducing the source-pixel electrode capacitance Csp in the pixel 110. Therefore, detailed description of the advantageous effect achieved by reducing the source-pixel electrode capacitance Csp in the pixel 210 is omitted.

A description will now be given of a method of producing (production steps for) the pixels 210 including the thin-film transistors 211. FIGS. 12A to 17B are schematic diagrams illustrating a method of producing (production steps for) the thin-film transistor array 200 according to the second embodiment of the present invention. FIGS. 12A to 17B each schematically show the structure of a pixel 210 in each step of producing the pixel 210 shown in FIGS. 11A and 11B, as in FIGS. 5A to 10B showing the method of producing (production steps for) the pixel 110. Specifically, FIGS. 12A, 13A, 14A, 15A, 16A and 17A show, as in FIG. 11A, schematic plan views of the structure of a pixel 210 in respective production steps, while FIGS. 12B, 13B, 14B, 15B, 16B and 17B show schematic cross-sectional views of the structure taken along the line B-B' of the plan view of the pixel 210 shown in FIG. 11A in respective production steps.

(Step 21)

Figure 12A:
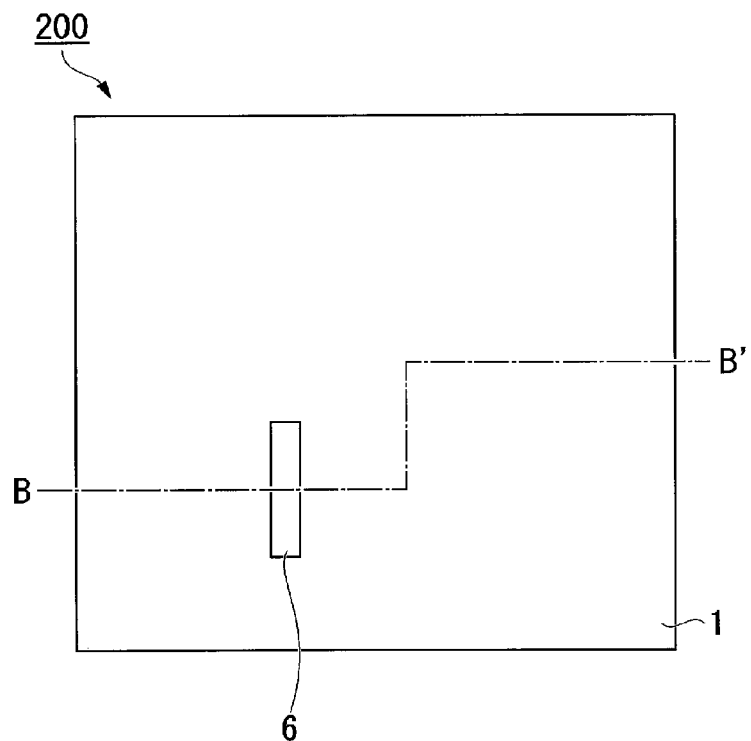
FIG. 12A is a schematic diagram illustrating a method of producing the thin-film transistor array according to the second embodiment.
Figure 12B:
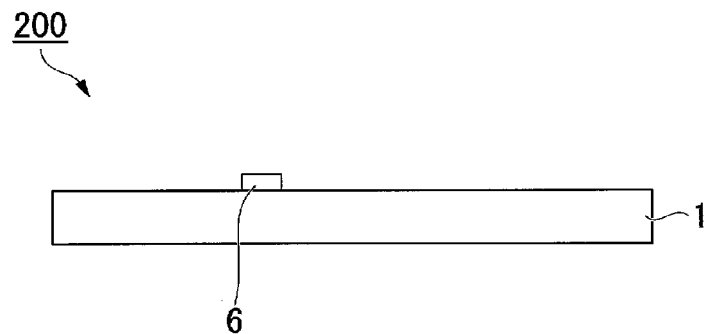
FIG. 12B is a schematic cross-sectional view illustrating a structure taken along the line B-B' of FIG. 12A.

As shown in FIGS. 12A and 12B, semiconductor patterns 6 are formed on an insulating substrate 1.

Materials used for the insulating substrate 1 may include inorganic materials such as glass, and organic materials such as polyethylene terephthalate (PET), polyethylene naphthalate (PEN), polyether sulfone (PES), polycarbonate, polyimide (PI), polyether imide (PEI), polystyrene (PS), polyvinyl chloride (PVC), polyethylene (PE), polypropylene (PP), nylon (Ny), and epoxy. Materials used for the semiconductor patterns 6 may include inorganic semiconductors such as amorphous silicon (a-Si) and polysilicon (poly-Si); and oxide semiconductors such as indium oxide (In$_2$O$_3$), gallium oxide (Ga$_2$O$_3$), zinc oxide (ZnO), tin oxide (SnO$_2$), indium-gallium-zinc oxide (InGaZnO), indium-gallium-tin oxide (InGaSnO), and indium-tin-zinc oxide (InSnZnO).

The method of preparing the semiconductor patterns 6 may be a method in which a material mentioned above for the semiconductor patterns 6 is formed into a film by plasma CVD on the insulating substrate 1, followed by photolithography, etching, and resist stripping.

In step 21, a contact layer, not shown, may be provided on the semiconductor patterns. Alternatively, in step 21, an etching stopper layer, not shown, may be formed on the semiconductor layers without forming (patterning) the semiconductor layer, and this etching stopper layer may be patterned. Then, after forming source electrodes 4 and drain electrodes 5 in step 22 described below (see FIGS. 13A and 13B), the semiconductor layer not covered with the etching stopper layer, the source electrodes 4, and the drain electrodes 5 may be etched away to provide semiconductor patterns 6.

(Step 22)

Figure 13A:
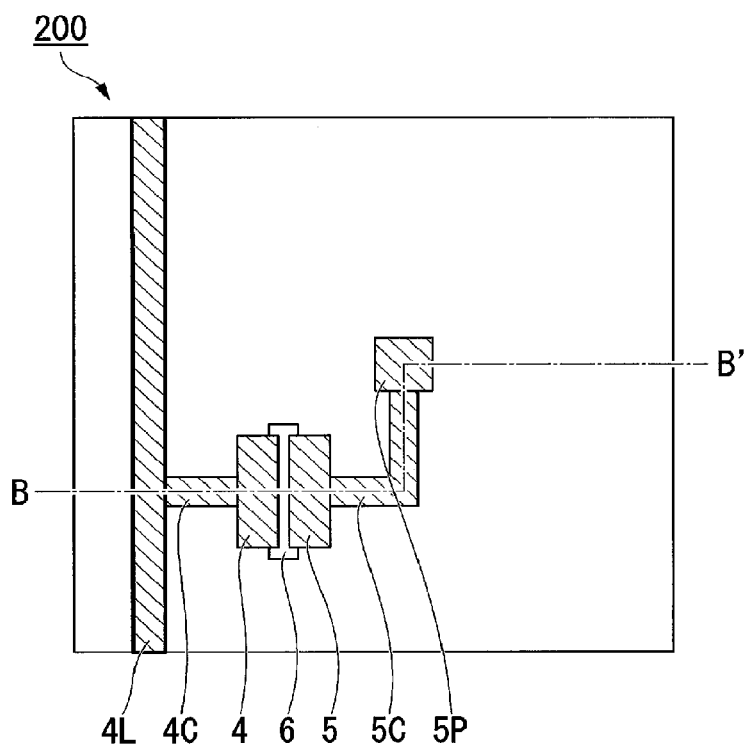
FIG. 13A is a schematic diagram illustrating a method of producing the thin-film transistor array according to the second embodiment.
Figure 13B:
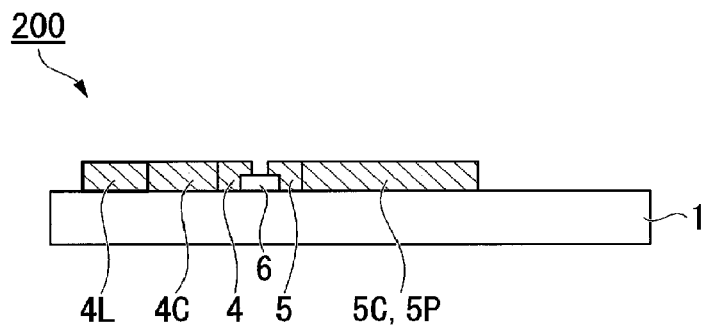
FIG. 13B is a schematic cross-sectional view illustrating a structure taken along the line B-B' of FIG. 13A.

As shown in FIGS. 13A and 13B, column wirings 4L, source connecting wirings 4C, source electrodes 4, drain electrodes 5, drain connecting wirings 5C, and drain pads 5P are formed on the insulating substrate 1 and the semiconductor patterns 6. In this case, the source electrodes 4 and the drain electrodes 5 are formed so as to be in contact with the respective semiconductor patterns 6.

Materials used for the column wirings 4L, the source connecting wirings 4C, the source electrodes 4, the drain electrodes 5, the drain connecting wirings 5C, and the drain pads 5P may include a metal such as aluminum (Al), silver (Ag), copper (Cu), chromium (Cr), nickel (Ni), molybdenum (Mo), gold (Au), platinum (Pt), and niobium (Nb); and electrically conductive oxides such as tin-doped indium oxide (ITO).

The method of preparing the column wirings 4L, the source connecting wirings 4C, the source electrodes 4, the drain electrodes 5, the drain connecting wirings 5C, and the drain pads 5P may be a method in which a film for the column wirings 4L is formed using a material mentioned above by sputtering or the like across the surfaces of the insulating substrate 1 and the semiconductor patterns 6 formed in step 21, followed by photolithography, etching, and resist stripping.

In step 21, if a contact layer, not shown, is provided on the semiconductor patterns, the contact layer between the source electrodes 4 and the drain electrodes 5 may be removed in step 22.

(Step 23)

Figure 14A:
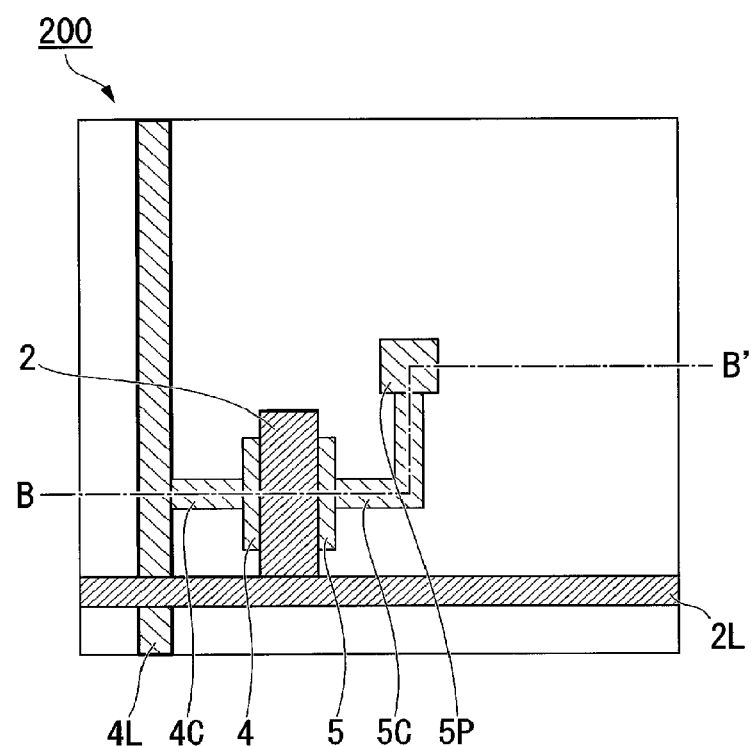
FIG. 14A is a schematic diagram illustrating a method of producing the thin-film transistor array according to the second embodiment.
Figure 14B:
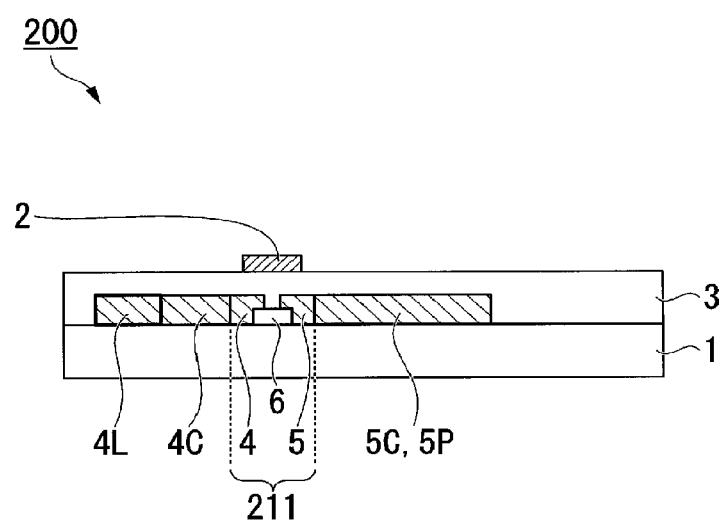
FIG. 14B is a schematic cross-sectional view illustrating a structure taken along the line B-B' of FIG. 14A.

As shown in FIGS. 14A and 14B, a gate insulating film 3 is formed on the insulating substrate 1, the semiconductor patterns 6, the column wirings 4L, the source connecting wirings 4C, the source electrodes 4, the drain electrodes 5, the drain connecting wirings 5C, and the drain pads 5P, and then row wirings 2L and gate electrodes 2 are further formed on the gate insulating film 3.

The row wirings 2L are formed so as to extend in the row direction (lateral direction) on the insulating substrate 1, and the gate electrodes 2 are formed so as to overlap with the respective semiconductor patterns 6 in the lamination direction.

Materials used for the gate insulating film 3 may be inorganic materials such as silicon dioxide (SiO$_2$), silicon oxynitride (SiON), and silicon nitride (SiN). The method of preparing the gate insulating film 3 may be a vacuum film forming method such as sputtering and chemical vapor deposition (CVD). Materials used for the row wirings 2L and the gate electrodes 2 may include a metal such as aluminum (Al), silver (Ag), copper (Cu), chromium (Cr), nickel (Ni), molybdenum (Mo), gold (Au), platinum (Pt), and niobium (Nb); and electrically conductive oxides such as tin-doped indium oxide (ITO), similarly to the electrodes or wirings formed in step 22.

The method of preparing the row wirings 2L or the electrodes 2 may be a method in which a material mentioned above for the gate electrodes 2 or the row wirings 2L is formed into a film by sputtering or the like over the entire surface of the gate insulating film 3 as formed, followed by photolithography, etching, and resist stripping.

(Step 24)

Figure 15A:
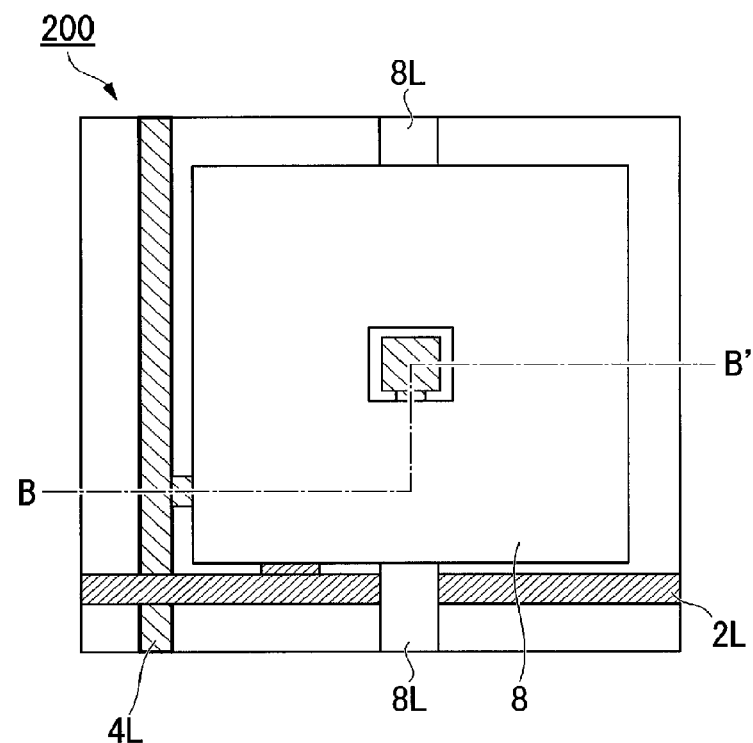
FIG. 15A is a schematic diagram illustrating a method of producing the thin-film transistor array according to the second embodiment.
Figure 15B:
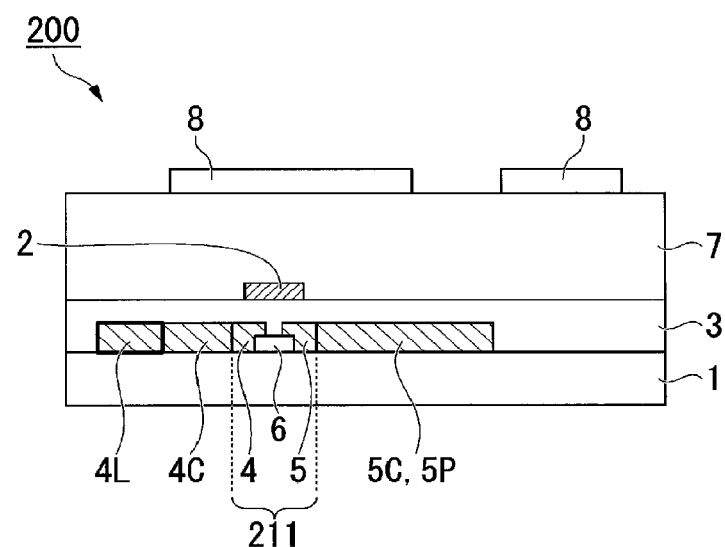
FIG. 15B is a schematic cross-sectional view illustrating a structure taken along the line B-B' of FIG. 15A.

As shown in FIGS. 15A and 15B, an interlayer insulating film 7 is formed on the gate insulating film 3, the gate electrodes 2, and the row wirings 2L. Furthermore, capacitor electrodes 8 and capacitor wirings 8L are formed on the interlayer insulating film 7.

Materials used for the interlayer insulating film 7 may be inorganic materials such as silicon dioxide (SiO$_2$), silicon oxynitride (SiON), and silicon nitride (SiN), similarly to the gate insulating film 3 formed in step 23.

The method of preparing the interlayer insulating film 7 may be a vacuum film forming method such as sputtering and chemical vapor deposition (CVD), similarly to the gate insulating film 3 formed in step 23. Materials used for the capacitor electrodes 8 and the capacitor wirings 8L may include a metal such as aluminum (Al), silver (Ag), copper (Cu), chromium (Cr), nickel (Ni), molybdenum (Mo), gold (Au), platinum (Pt), and niobium (Nb); and electrically conductive oxides such as tin-doped indium oxide (ITO), similarly to the source electrodes 4 or the drain electrodes 5 formed in step 22, or the row wirings 2L, the gate electrodes 2, or the like formed in step 23.

The method of preparing the capacitor electrodes 8 and capacitor wirings 8L may be a method in which a material mentioned above for the capacitor electrodes 8 and the capacitor wirings 8L is formed into a film by sputtering or the like over the entire surface of the interlayer insulating film 7 as formed, followed by photolithography, etching, and resist stripping.

(Step 25)

Figure 16A:
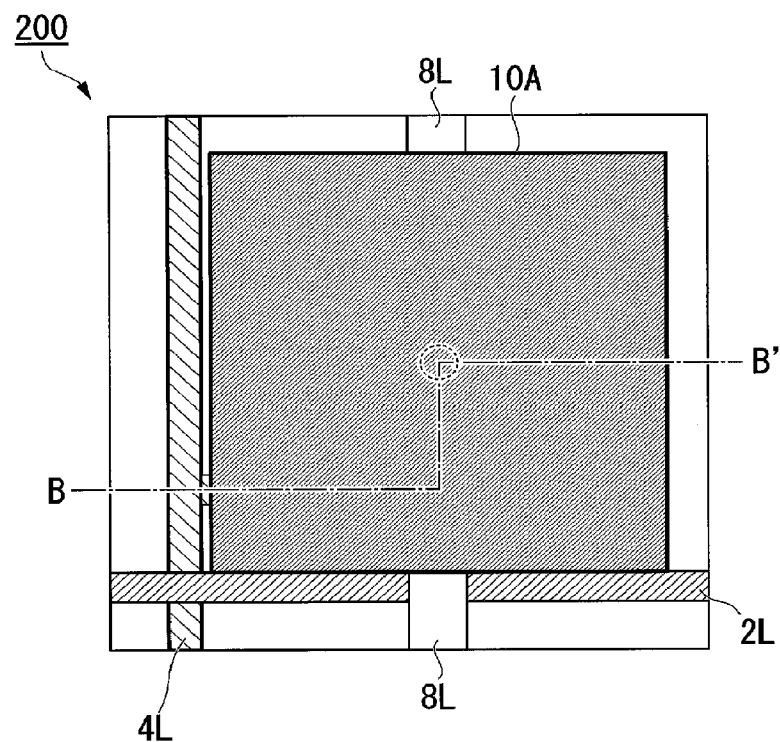
FIG. 16A is a schematic diagram illustrating a method of producing the thin-film transistor array according to the second embodiment.
Figure 16B:
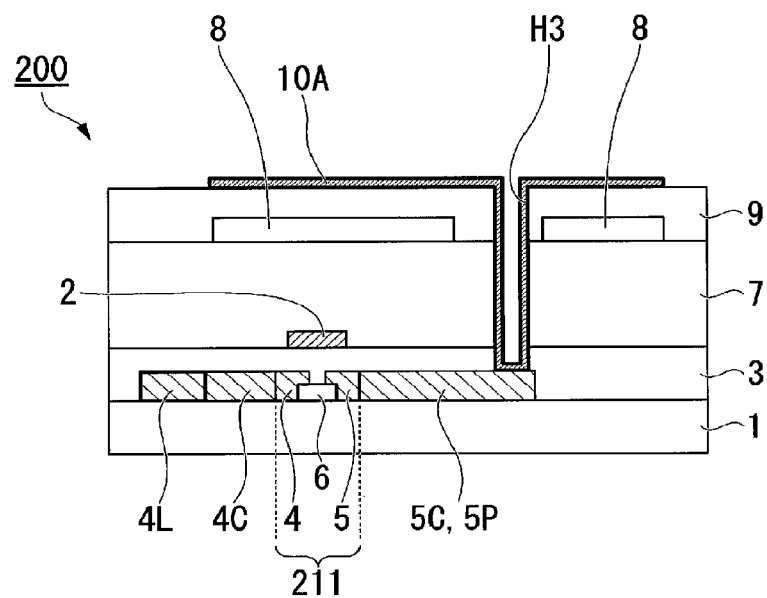
FIG. 16B is a schematic cross-sectional view illustrating a structure taken along the line B-B' of FIG. 16A.

As shown in FIGS. 16A and 16B, a capacitor insulating film 9 is formed on the interlayer insulating film 7, the capacitor electrodes 8 and the capacitor wirings 8L, and then lower pixel electrodes 10A are further formed. In this case, recesses are formed in the capacitor insulating film 9, the interlayer insulating film 7, and the gate insulating film 3 at positions above the respective drain pads 5P, and lower electrodes 10A are formed so as to contact the respective drain pads 5P in these recesses. Specifically, the lower pixel electrodes 10A are formed so as to be connected to the respective drain pads 5P via drain connecting openings H3 formed in the capacitor insulating film 9, the interlayer insulating film 7, and the gate insulating film 3.

Materials used for the capacitor insulating film 9 may be inorganic materials such as silicon dioxide ($SiO_2$), silicon oxynitride (SiON), and silicon nitride (SiN), similarly to the gate insulating film 3 formed in step 23, or the interlayer insulating film 7 formed in step 24. The method of preparing the capacitor insulating film 9 may be a vacuum film forming method such as sputtering and chemical vapor deposition (CVD), similarly to the gate insulating film 3 formed in step 23, or the interlayer insulating film 7 formed in step 24. As a method of forming recesses in the capacitor insulating film 9, the interlayer insulating film 7, and the gate insulating film 3, photolithography, dry etching, and resist stripping may be preferred. Materials used for the lower pixel electrodes 10A may include a metal such as aluminum (Al), silver (Ag), copper (Cu), chromium (Cr), nickel (Ni), molybdenum (Mo), gold (Au), platinum (Pt), and niobium (Nb); and electrically conductive oxides such as tin-doped indium oxide (ITO), similarly to the electrodes or wirings formed in steps 22, 23 and 24.

The method of preparing the lower pixel electrodes 10A may be a method in which a material mentioned above for the lower pixel electrodes 10A is formed into a film by sputtering or the like over the entire surface, followed by photolithography, etching, and resist stripping, similarly to the method of forming the electrodes or wirings in steps 22, 23 and 24.

(Step 26)

Figure 17A:
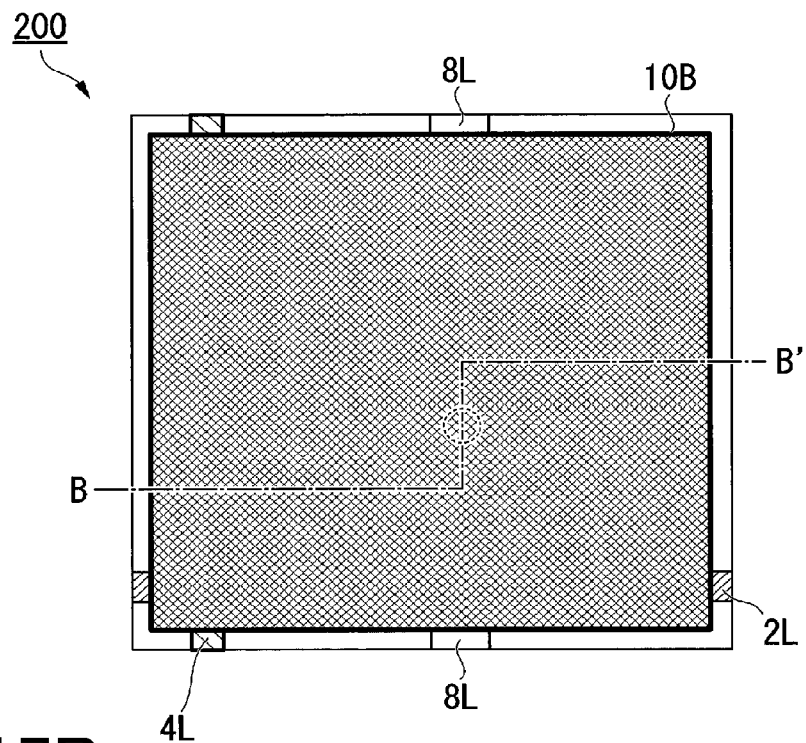
FIG. 17A is a schematic diagram illustrating a method of producing the thin-film transistor array according to the second embodiment.
Figure 17B:
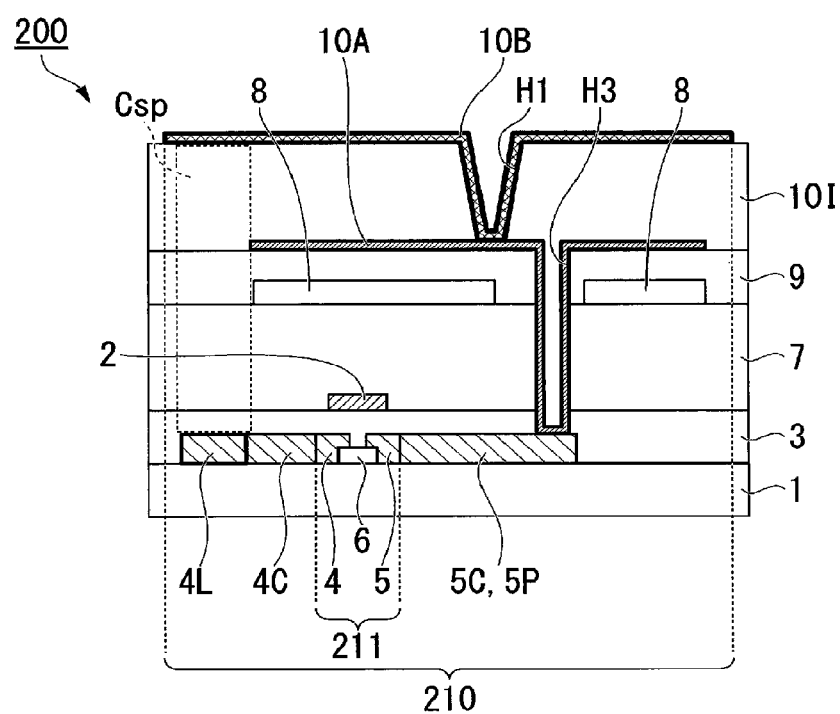
FIG. 17B is a schematic cross-sectional view illustrating a structure taken along the line B-B' of FIG. 17A.

As shown in FIGS. 17A and 17B, an intermediate insulating film 10I is formed on the capacitor insulating film 9 and the lower pixel electrodes 10A. The intermediate insulating film 10I is provided with openings H1 in portions thereof. Furthermore, upper pixel electrodes 10B are formed on the intermediate insulating film 10I. In this case, the upper pixel electrodes 10B are formed so as to be connected to the respective lower pixel electrodes 10A via the intermediate insulating film 10I at positions of the openings H1 of the intermediate insulating film 10I.

As a material for the intermediate insulating film 10I, a photosensitive resin may be used. The method of preparing the intermediate insulating film 10I is preferred to be a method in which a photosensitive resin is exposed and developed, and formed into a shape having openings H1.

Materials used for the upper pixel electrodes 10B may include a metal such as aluminum (Al), silver (Ag), copper (Cu), chromium (Cr), nickel (Ni), molybdenum (Mo), gold (Au), platinum (Pt), and niobium (Nb); and electrically conductive oxides such as tin-doped indium oxide (ITO), similarly to the electrodes or wirings formed in steps 22, 23, 24 and 25.

The method of preparing the upper pixel electrodes 10B may be a method in which a material mentioned above for the upper pixel electrodes 10B is formed into a film by sputtering or the like over the entire surface, followed by photolithography, etching, and resist stripping, similarly to the electrodes or wirings formed in steps 22, 23, 24 and 25.

Through these steps, a thin-film transistor array 200 is produced in which a plurality of pixels 210 are arranged in a matrix, being provided with respective pixel electrodes 10 each configured by two electrically conductive layers, i.e., a lower pixel electrode 10A and an upper pixel electrode 10B, similarly to the thin-film transistor array 100 of the first embodiment. Thus, similarly to the thin-film transistor array 100 of the first embodiment, the thin-film transistor array 200 can also reduce power consumption when rewriting the display, even more than the thin-film transistor array 900, for example, in which a plurality of pixels 910 having a conventional structure are arranged in a matrix.

As described above, in the thin-film transistor array 200 according to the second embodiment, the pixel electrodes 10 provided to the respective pixels 210 arranged in a matrix are each configured by two electrically conductive layers, i.e., the lower pixel electrode 10A and the upper pixel electrode 10B, as in the thin-film transistor array 100 according to the first embodiment. Thus, similarly to the thin-film transistor array 100 according to the first embodiment, the thin-film transistor array 200 according to the second embodiment can reduce capacitance between the column wiring 4L and the upper pixel electrode 10B configured in each pixel 210, even more than the capacitance between the column wiring 4L and the conventional single-layer pixel electrode 10 configured in each conventional pixel 910. Accordingly, a display device using the thin-film transistor array 200 according to the second embodiment can achieve low power consumption, similarly to the display device using the thin-film transistor array 100 according to the first embodiment.

The thin-film transistor array 200 according to the second embodiment has been described assuming the case of forming pixels 210 each including, as shown in FIGS. 11A, 11B and 12A to 17B, similarly to the thin-film transistor array 100 according to the first embodiment, a thin-film transistor 211 having a top contact structure in which the source electrode 4 and the drain electrodes 5 are provided on the semiconductor pattern 6. However, the structure of the thin-film transistor 211 provided to each pixel 210 in the thin-film transistor array 200 is not limited to the thin-film transistor having a top contact structure. For example, the thin-film transistor 211 may have a structure in which the semiconductor pattern 6 is provided on the source electrode 4 and the drain electrode 5, i.e., may have a bottom contact structure.

According to the above embodiment, the pixel electrode provided to each of the pixels arranged in a matrix in the thin-film transistor array is configured by two electrically conductive layers, i.e. a lower pixel electrode and an upper pixel electrode, with an intermediate insulating film sandwiched therebetween. Thus, the thin-film transistor array according to the present embodiment can reduce capacitance between the column wiring and the upper pixel electrode configured in each pixel, even more than the capacitance between the column wiring and the conventional single-layer pixel electrode configured in each conventional pixel. Thus, the thin-film transistor array of the present embodiment can reduce power consumption when rewriting the display, even more than a thin-film transistor array in which a plurality of pixels having a conventional structure are arranged in a matrix. Accordingly, a display device using the thin-film transistor array according to the present embodiment can achieve low power consumption.

As described above, the intermediate insulating film 10I formed (sandwiched) between the lower and upper pixel electrodes 10A and 10B is preferred to be made of a resin in each of the pixels 110 of the thin-film transistor array 100 according to the first embodiment described referring to FIGS. 1A and 1B and in each of the pixels 210 of the thin-film transistor array 200 according to the second embodiment described referring to FIGS. 11A and 11B.

Materials that can be used for the intermediate insulating film 10I may include acrylic, epoxy, polyimide, polyamide, polyester, polyvinyl phenol, polyvinyl alcohol, polyvinyl acetate, polyurethane, polysulfone, polyvinylidene fluoride, cyanoethyl pullulan, phenol resin, benzocyclobutene resin, polystyrene, polycarbonate, olefin resin, fluororesin, silicon resin, and polymer alloys or copolymers of these resins. Also, composite materials including organic or inorganic fillers can be used. Since relative permittivity εmi of such resins is smaller than that of inorganic materials, capacitance between the column wiring 4L and the upper pixel electrode 10B (source-pixel electrode capacitance Csp) can be reduced even if the thickness (film thickness) Dmi of the intermediate insulating film 10I is small.

The opening H1 of the intermediate insulating film 10I in cross-sectional view is preferred to have a forward tapered shape with a width thereof reduced downward in each of the pixels 110 of the thin-film transistor array 100 according to the first embodiment described referring to FIGS. 1A and 1B and in each of the pixels 210 of the thin-film transistor array 200 according to the second embodiment described referring to FIGS. 11A and 11B. If the opening H1 of the intermediate insulating film 10I has a forward tapered shape in cross-sectional view, the upper pixel electrode 10B is prevented from being cut due to the level difference of the opening H1 of the intermediate insulating film 10I, and thus the upper pixel electrode 10B can be reliably connected to the lower pixel electrode 10A.

The semiconductor patterns 6 are made of amorphous silicon (Si) in the pixels 110 of the thin-film transistor array 100 according to the first embodiment described referring to FIGS. 1A and 1B and in the pixels 210 of the thin-film transistor array 200 according to the second embodiment described referring to FIGS. 11A and 11B. In this case, the intermediate insulating film 10I is preferred to have light transmittance of 50% or less for a wavelength in the range of 500 nm to 600 nm. Since this amorphous silicon (Si) has a high light absorption coefficient in the wavelength range of 500 nm to 600 nm, then of external light, light in the wavelength range of 500 nm to 600 nm can be reduced (attenuated), thereby preventing errors. In this case, for example, a resin used for red color filters can be used as the resin for the intermediate insulating film 10I.

If the upper pixel electrode 10B or the lower pixel electrode 10A has light shielding properties, or, if the capacitor electrode 8 has light shielding properties and covers the channel portion in each of the pixels 110 of the thin-film transistor array 100 according to the first embodiment described referring to FIGS. 1A and 1B and in each of the pixels 210 of the thin-film transistor array 200 according to the second embodiment described referring to FIGS. 11A and 11B, external light is unlikely to enter the channel. Therefore, the transistor array can be operated if the intermediate insulating film 10I has light transmittance of 50% or less in the wavelength range of 500 nm to 600 nm. However, it is preferred that the intermediate insulating film 10I has light transmittance of 50% or less in the wavelength range of 500 nm to 600 nm, from the perspective of cutting out external light.

If the upper and lower pixel electrodes 10B and 10A are transparent and if the capacitor electrode 8 has a structure not covering the channel or is transparent in each of the pixels 110 of the thin-film transistor array 100 according to the first embodiment described referring to FIGS. 1A and 1B and in each of the pixels 210 of the thin-film transistor array 200 according to the second embodiment described referring to FIGS. 11A and 11B, the intermediate insulating film 10I should have light transmittance of 50% or less in the wavelength range of 500 nm to 600 nm.

It is preferred that the gate insulating film 3, the interlayer insulating film 7, and the capacitor insulating film 9 are made of an inorganic material such as silicon nitride (SiN), silicon dioxide (SiO$_2$), or silicon oxynitride (SiON) in each of the pixels 110 in the thin-film transistor array 100 according to the first embodiment described referring to FIGS. 1A and 1B and in each of the pixels 210 in the thin-film transistor array 200 according to the second embodiment described referring to FIGS. 11A and 11B If the gate insulating film 3, the interlayer insulating film 7, and the capacitor insulating film 9 are made of an inorganic material such as silicon nitride (SiN), silicon dioxide (SiO$_2$), or silicon oxynitride (SiON), the insulating films (the gate insulating film 3, interlayer insulating film 7, and capacitor insulating film 9) that are present between the gate electrode 2, the source electrode 4, the drain electrode 5, the capacitor electrode 8, and the lower pixel electrode 10A will be smooth and will have high withstand voltage. This may enhance reliability of the pixels 110 or the pixels 210, i.e., the thin-film transistor array 100 or the thin-film transistor array 200. The lower pixel electrode 10A and the upper pixel electrode 10B formed on both sides (both surfaces) of the intermediate insulating film 10I are equal in potential in each of the pixels 110 of the thin-film transistor array 100 according to the first embodiment described referring to FIGS. 1A and 1B and in each of the pixels 210 of the thin-film transistor array 200 according to the second embodiment described referring to FIGS. 11A and 11B, and therefore the intermediate insulating film 10I does not have to have high withstand voltage.

It is considered that capacitance between the pixel electrode 10 and the column wiring 4L, the source connecting wiring 4C, and the source electrode 4 (source-pixel electrode capacitance Csp) can also be reduced by increasing the thickness (film thickness) Dil of the interlayer insulating film 7 in each of the pixels 710 of the conventional thin-film transistor array 700 shown in FIGS. 20A and 20B or each of the pixels 810 of the conventional thin-film transistor array 800 shown in FIGS. 21A and 21B. However, (1) in the conventional pixels 710 or 810, the portion configuring the storage capacitance Cs cannot be brought into alignment with the thin-film transistor in plan view, and thus the area configuring the storage capacitance Cs cannot be increased. In addition, (2) in the conventional pixels 710 or 810, the insulating film configuring the storage capacitance Cs is the gate insulating film 3, and therefore, the thickness (film thickness) of the insulating film cannot be changed independently of the film thickness of the thin-film transistor portion. For the two reasons provided above, the storage capacitance Cs cannot be increased in the conventional pixels 710 or 810, and the degree of flexibility (tolerance) when designing pixels is reduced.

In this regard, for example, in each of the pixels 110 of the thin-film transistor array 100 of the first embodiment shown in FIGS. 1A and 1B, the thickness Dci of the capacitor insulating film 9 configuring the storage capacitance Cs can be set to a thickness (film thickness) different from that of the gate insulating film 3. Furthermore, in each pixel 110, a maximum voltage that can be applied to the capacitor insulating film 9 is smaller than the maximum voltage that can be applied to the gate insulating film 3. Accordingly, if the material of the capacitor insulating film 9 is the same as that of the gate insulating film 3, the thickness (film thickness) Dci of the capacitor insulating film 9 can be reduced.

Capacitance between the column wiring 4L and the pixel electrode 10 (source-pixel electrode capacitance Csp) can also be reduced by increasing the thickness (film thickness) Dil of the interlayer insulating film 7 in each of the pixels 510 of the conventional thin-film transistor array 500 shown in FIGS. 18A and 18B or each of the pixels 910 of the conventional thin-film transistor array 900 shown in FIGS. 22A and 22B. However, in this case, smoothness in the capacitor electrode 8, the capacitor insulating film 9, and the pixel electrode 10 is deteriorated in each of the conventional pixels 510 or 910, and therefore, voltage resistance is impaired.

First Production Example

Next, examples of practically producing thin-film transistor arrays of the above embodiment will be described. First, a first production example for the thin-film transistor array 100 shown in FIGS. 1A, 1B and 5A to 10B will be described.

In step 11 (see FIGS. 5A and 5B) of the first production example, a glass substrate was used as an insulating substrate 1 to form a film of molybdenum (Mo) thereon by sputtering, followed by applying a photoresist, etching away the molybdenum (Mo), and removing the resist, thereby forming row wirings 2L and gate electrodes 2.

Next, in step 12 (see FIGS. 6A and 6B), a film of silicon nitride (SiN) was formed as a gate insulating film 3, and then a film of amorphous silicon (a-Si) for semiconductor patterns 6, and a film of n+ amorphous silicon (a-Si) as a contact layer were formed, followed by applying a resist, etching away the silicon (Si), and removing the resist, thereby forming semiconductor patterns 6.

Next, in step 13 (see FIGS. 7A and 7B), a film of molybdenum (Mo) was formed, followed by applying a resist, etching away the molybdenum (Mo), and removing the resist, thereby forming source electrodes 4, source connecting wirings 4C, column wirings 4L, drain electrodes 5, drain connecting wirings 5C, and drain pads 5P. Furthermore, the silicon (Si) was subjected to etching for a short time to remove portions of the contact layer above the channels of the semiconductor patterns 6.

Next, in step 14 (see FIGS. 8A and 8B), a film of silicon nitride (SiN) was formed as an interlayer insulating film 7, and then a film of tin-doped indium oxide (ITO) was formed, followed by applying a resist, etching away the tin-doped indium oxide (ITO), and removing the resist, thereby forming capacitor electrodes 8 and capacitor wirings 8L.

Next, in step 15 (see FIGS. 9A and 9B), a film of silicon nitride (SiN) was formed as a capacitor insulating film 9, followed by applying a resist, etching away the silicon nitride (SiN), and removing the resist, thereby forming drain connecting openings H2 in the capacitor insulating film 9 and the interlayer insulating film 7. After that, a film of tin-doped indium oxide (ITO) was formed, followed by applying a resist, etching away the tin-doped indium oxide (ITO), and removing the resist, thereby forming low pixel electrodes 10A.

Next, in step 16 (see FIGS. 10A and 10B), exposure and development were performed using a photosensitive resin used for red color filters, thereby forming an intermediate insulating film 10I having forward tapered openings H1.

Furthermore, in step 16 (see FIGS. 10A and 10B), a film of tin-doped indium oxide (ITO) was formed, followed by applying a resist, etching away the tin-doped indium oxide (ITO), and removing the resist, thereby forming upper pixel electrodes 10B. In this case, the intermediate insulating film 10I had light transmittance of 50% or less in the wavelength range of 500 nm to 600 nm, as measured using a simultaneously prepared test substrate.

In the thin-film transistor array 100 produced here, an area Sgs where the gate electrodes 2 overlapped the source electrodes 4 (termed gate electrode-source electrode overlap area hereinafter) was Sgs=168 $\mu m^2$, an area Ssc where the source electrodes 4 overlapped the capacitor electrodes 8 (termed source electrode-capacitor electrode overlap area hereinafter) was Ssc=273 $\mu m^2$, and an area Ssp where the column wirings 4L overlapped the pixel electrodes 10 (termed source wiring-pixel electrode overlap area hereinafter), in the lamination direction was Ssp=936 $\mu m^2$.

Also, in the thin-film transistor array 100, the gate insulating film 3 had a thickness (film thickness) Dgi=0.5 $\mu m$, the interlayer insulating film 7 had a thickness (film thickness) Dil=1 $\mu m$, the capacitor insulating film 9 had a thickness (film thickness) Dci=0.4 $\mu m$, and the intermediate insulating film 10I had a thickness (film thickness) Dmi=2 $\mu m$.

Furthermore, in a thin-film transistor array 100, since silicon nitride (SiN) has a relative permittivity=7 and the intermediate insulating film 10I has a relative permittivity=3, the gate-source capacitance Cgs=21 fF, the source-capacitor capacitance Csc=17 fF, and the source-pixel electrode capacitance Csp=9 fF.

Furthermore, in a thin-film transistor array 100, since the number of column wirings 4L is given by M=640, the number of row wirings 2L is given by N=480, and write voltage Vs=15 V, power consumption of the column wirings 4L per frame is 3.1 mJ. It was confirmed that an electrophoretic electronic paper display device using the thin-film transistor array 100 produced in the first production example operated normally in sunlight.

Second Production Example

Next, a second production example for the thin-film transistor array 200 shown in FIGS. 11A, 11B and 12A to 17B will be described.

In step 21 (see FIGS. 12A and 12B) of the second production example, a glass substrate was used as an insulating substrate 1, and a film of amorphous silicon (a-Si) as semiconductor patterns 6 and a film of n+ amorphous silicon (a-Si) as a contact layer were formed on the glass substrate, followed by applying a resist, etching away the silicon (Si), and removing the resist, thereby forming semiconductor patterns 6.

Next, in step 22 (see FIGS. 13A and 13B), a film of molybdenum (Mo) was formed by sputtering, followed by applying a photoresist, etching away the molybdenum (Mo), and removing the resist, thereby forming source electrodes 4, source connecting wirings 4C, column wirings 4L, drain electrodes 5, drain connecting wirings 5C, and drain pads 5P. Furthermore, the silicon (Si) was subjected to etching for a short time to remove portions of the contact layer above the channels of the semiconductor patterns 6.

In step 23 (see FIGS. 14A and 14B), a film of silicon nitride (SiN) was formed as a gate insulating film 3, and further, a film of molybdenum (Mo) was formed by sputtering, followed by applying a resist, etching away the molybdenum (Mo), and removing the resist, thereby forming row wirings 2L and gate electrodes 2.

Next, in step 24 (see FIGS. 15A and 15B), a film of silicon nitride (SiN) was formed as an interlayer insulating film 7, and then a film of molybdenum (Mo) was formed, followed by applying a resist, etching away the molybdenum (Mo), and removing the resist, thereby forming capacitor electrodes 8 and capacitor wirings 8L.

Next, in step 25 (see FIGS. 16A and 16B), a film of silicon nitride (SiN) was formed as a capacitor insulating film 9, followed by applying a resist, etching away the silicon nitride (SiN), and removing the resist, thereby forming drain connecting openings H3 in the capacitor insulating film 9, the interlayer insulating film 7, and the gate insulating film 3. After that, a film of tin-doped indium oxide (ITO) was formed, followed by applying a resist, etching away the tin-doped indium oxide (ITO), and removing the resist, thereby forming low pixel electrodes 10A.

Next, in step 26 (see FIGS. 17A and 17B), exposure and development were performed using a polyimide-based photosensitive resin, thereby forming an intermediate insulating film 10I having forward tapered openings H1. Furthermore, in step 26 (see FIGS. 17A and 17B), a film of tin-doped indium oxide (ITO) was formed, followed by applying a resist, etching away the tin-doped indium oxide (ITO), and removing the resist, thereby forming upper pixel electrodes 10B.

In the thin-film transistor array 200 produced here, the gate electrode-source electrode overlap area Sgs=168 $\mu m^2$, the source electrode-capacitor electrode overlap area Ssc=121 $\mu m^2$, and the source wiring-pixel electrode overlap area Ssp=920 $\mu m^2$.

Also, in the thin-film transistor array 200, the gate insulating film 3 had a thickness (film thickness) Dgi=0.5 the interlayer insulating film 7 had a thickness (film thickness) Dil=1 the capacitor insulating film 9 had a thickness (film thickness) Dci=0.4 and the intermediate insulating film 10I had a thickness (film thickness) Dmi=2 $\mu m$.

Furthermore, in a thin-film transistor array 200, since silicon nitride (SiN) has a relative permittivity=7 and the intermediate insulating film 10I has a relative permittivity=3.5, the gate-source capacitance Cgs=21 fF, the source-capacitor capacitance Csc=5 fF, and the source-pixel electrode capacitance Csp=9 fF.

Furthermore, in a thin-film transistor array 200, since the number of column wirings 4L is given by M=640, the number of row wirings 2L is given by N=480, and write voltage Vs=15 V, power consumption of the column wirings 4L per frame is 2.4 mJ. It was confirmed that an electrophoretic electronic paper display device using the thin-film transistor array 200 produced in the second production example operated normally in sunlight.

Third Production Example

Next, a third production example will be described. In the third production example, a thin-film transistor array 100 shown in FIGS. 1A, 1B and 5A to 10B was produced through steps similar to those of the first production example. However, in the third production example, an acrylic transparent photosensitive resin was used for an intermediate insulating film 10I, instead of the photosensitive resin used for red color filters. In this case, the intermediate insulating film 10I had light transmittance of 60% or more in the wavelength range of 500 nm to 600 nm, as measured using a simultaneously prepared test substrate.

In the thin-film transistor array 100 produced here, the gate electrode-source electrode overlap area Sgs was 168 $\mu m^2$, the source electrode-capacitor electrode overlap area Ssc was 273 $\mu m^2$, and the source wiring-pixel electrode overlap area Ssp was 936 $\mu m_2$.

Also, in the thin-film transistor array 100, the gate insulating film 3 had a thickness (film thickness) Dgi=0.5 the interlayer insulating film 7 had a thickness (film thickness) Dil=1 the capacitor insulating film 9 had a thickness (film thickness) Dci=0.4 and the intermediate insulating film 10I had a thickness (film thickness) Dmi=2 $\mu m$.

Furthermore, in a thin-film transistor array 100, since silicon nitride (SiN) has a relative permittivity=7 and the intermediate insulating film 10I has a relative permittivity=3, the gate-source capacitance Cgs=21 fF, the source-capacitor capacitance Csc=17 fF, and the source-pixel electrode capacitance Csp=9 fF.

Furthermore, in a thin-film transistor array 100, since the number of column wirings 4L is given by M=640, the number of row wirings 2L is given by N=480, and write voltage Vs=15 V, power consumption of the column wirings 4L per frame is 3.1 mJ. It was confirmed that an electrophoretic electronic paper display device using the thin-film transistor array 100 produced in the third production example operated normally in indoor light; however, contrast was impaired in sunlight.

First Comparative Example

Herein, examples of conventional thin-film transistor arrays will be described, which were produced to confirm the advantageous effects of the thin-film transistor array 100 or the thin-film transistor array 200 of the above embodiment. First, a first comparative example will be described, in which the thin-film transistor array 500 shown in FIGS. 18A and 18B was produced through the steps of producing the thin-film transistor array 100 shown in FIGS. 5A to 9B.

In the thin-film transistor array 500 produced here, the gate electrode-source electrode overlap area Sgs=168 $\mu m^2$, the source electrode-capacitor electrode overlap area Ssc=273 $\mu m^2$, and the source wiring-pixel electrode overlap area Ssp=936 $\mu m^2$.

Also, in the thin-film transistor array 500, the gate insulating film 3 had a thickness (film thickness) Dgi=0.5 the interlayer insulating film 7 had a thickness (film thickness) Dil=1 and the capacitor insulating film 9 had a thickness (film thickness) Dci=0.4 $\mu m$.

Furthermore, in a thin-film transistor array 500, since silicon nitride (SiN) has a relative permittivity=7, the gate-source capacitance Cgs=21 fF, the source-capacitor capacitance Csc=17 fF, and the source-pixel electrode capacitance Csp=39 fF.

Furthermore, in a thin-film transistor array 500, since the number of column wirings 4L is given by M=640, the number of row wirings 2L is given by N=480, and write voltage Vs=15 V, power consumption of the column wirings 4L per frame is 5.2 mJ.

Second Comparative Example

Next, a second comparative example will be described. In the second comparative example, the thin-film transistor array 900 shown in FIGS. 22A and 22B was produced through the steps of producing the thin-film transistor array 200 shown in FIGS. 12A to 16B will be described.

In the thin-film transistor array 900 produced here, the gate electrode-source electrode overlap area Sgs=168 μm$^2$, the source electrode-capacitor electrode overlap area Ssc=121 μm$^2$, and the source wiring-pixel electrode overlap area Ssp=920 μm$^2$.

Also, in the thin-film transistor array 900, the gate insulating film 3 had a thickness (film thickness) Dgi=0.5 the interlayer insulating film 7 had a thickness (film thickness) Dil=1 and the capacitor insulating film 9 had a thickness (film thickness) Dci=0.4 μm.

Furthermore, in a thin-film transistor array 900, since silicon nitride (SiN) has a relative permittivity=7, the gate-source capacitance Cgs=21 fF, the source-capacitor capacitance Csc=5 fF, and the source-pixel electrode capacitance Csp=29 fF.

Furthermore, in a thin-film transistor array 900, since the number of column wirings 4L is given by M=640, the number of row wirings 2L is given by N=480, and write voltage Vs=15 V, power consumption of the column wirings 4L per frame is 3.7 mJ.

As will be understood from a comparison of the first to third production examples with the first and second comparative examples, the thin-film transistor array of the present embodiment can reduce power consumption of the column wirings 4L per frame even more than in the conventional thin-film transistor arrays. This is because, in the thin-film transistor array of the present embodiment, the pixel electrode provided to each of the pixels arranged in a matrix in the thin-film transistor array is configured by two electrically conductive layers, i.e., a lower pixel electrode and an upper pixel electrode, with an intermediate insulating film sandwiched therebetween, and because the source-pixel electrode capacitance Csp is lower than in the conventional thin-film transistor arrays.

As described above, according to the present embodiment, the pixel electrode provided to each of the pixels arranged in a matrix in the thin-film transistor array is configured by two electrically conductive layers, i.e. a lower pixel electrode and an upper pixel electrode, with an intermediate insulating film sandwiched therebetween. Thus, the thin-film transistor array according to the present embodiment can reduce capacitance between the column wiring and the upper pixel electrode (source-pixel electrode capacitance Csp) in each pixel, even more than the capacitance between a column wiring and a single-layer pixel electrode (source-pixel electrode capacitance Csp) in each conventional pixel. Thus, the thin-film transistor array of the present embodiment can reduce power consumption when rewriting the display, even more than a thin-film transistor array in which a plurality of pixels having a conventional structure are arranged in a matrix.

Accordingly, a display device using the thin-film transistor array according to the present embodiment can achieve low power consumption. If a thin-film transistor array of the present embodiment is applied to a display device in which the display is rewritten using electrical power of the incorporated battery, the frequency of battery replacement can be reduced. If a thin-film transistor array of the present embodiment is applied to a display device in which the display is rewritten using electrical power obtained as a result of converting radio waves from an RFID reader/writer, rewriting can be performed even with weak radio waves and the distance to the reader/writer during rewriting can be increased.

Some embodiments of the present invention have been described so far with reference to the drawings. However, specific configurations are not limited to those of the embodiments. Various modifications without departing from the spirit of the present invention should also be encompassed by the present invention.

The present application addresses the following. The display devices, in which an electronic paper display device is combined with an RFID device, can be categorized into two types which are: (1) Display devices in which the display is rewritten using electrical power from an incorporated battery; and (2) Display devices in which the display is rewritten using electrical power converted from radio waves received from an RFID reader/writer for rewriting data. However, in both of these types of display devices, reducing power consumption when rewriting the display remains as an issue to be addressed. In the former type of display devices that rewrite the display using electrical power of an incorporated battery, the battery is required to be frequently changed if power consumption is high. In the latter type of display devices that rewrite the display using electrical power converted from radio waves of an RFID reader/writer, the display can be rewritten only in a short range where radio waves are strong, if power consumption is high.

The present invention has an aspect to provide a thin-film transistor array which can reduce power consumption when rewriting the display, and a method of producing the thin-film transistor array.

In a thin-film transistor array formed on an insulating substrate according to a first aspect of the present invention, the thin-film transistor array comprises a plurality of pixels each including a thin-film transistor, a pixel electrode, and a capacitor electrode; the plurality of pixels are arranged in a matrix, being located at positions where a plurality of column wirings extending in a column direction intersect a plurality of row wirings perpendicular to the column wirings and extending in a row direction; the thin-film transistor includes a gate electrode, a source electrode, a drain electrode, and a semiconductor pattern located between the source electrode and the drain electrode; the semiconductor pattern is disposed at a position aligning with the gate electrode in a lamination direction via a gate insulating film; the capacitor electrode is disposed above the thin-film transistor in the lamination direction via an interlayer insulating film; the pixel electrode is disposed above the capacitor electrode in the lamination direction via a capacitor insulating film; the source electrode is connected to a corresponding one of the column wirings; the gate electrode is connected to a corresponding one of the row wirings; the drain electrode is connected to the pixel electrode; the capacitor electrode is connected to a capacitor wiring; the pixel electrode is configured by two electrically conductive layers which are a lower layer electrode serving as a lower pixel electrode, and an upper layer electrode serving as an upper pixel electrode; an intermediate insulating film is sandwiched between the lower pixel electrode and the upper pixel electrode; the upper pixel electrode is connected to the lower pixel electrode through an opening of the intermediate insulating film; capacitance is configured by an overlap between the capacitor electrode and the lower pixel electrode; and the corresponding one of the column wirings is disposed at a position providing no overlap with the capacitor electrode and the lower pixel electrode, but providing an overlap with the upper pixel electrode, in the lamination direction.

The intermediate insulating film of the thin-film transistor array may be a resin.

In the thin-film transistor array, the opening of the intermediate insulating film may have a forward tapered shape in cross-sectional view perpendicular to the lamination direction.

In the thin-film transistor array, the semiconductor pattern may be amorphous silicon; and the intermediate insulating film may have light transmittance of 50% or less in the wavelength range of 500 nm to 600 nm.

In the thin-film transistor array, the gate insulating film, the interlayer insulating film, and the capacitor insulating film may be inorganic materials.

A method of producing a thin-film transistor array according to a second aspect of the present invention includes steps of at least forming elements on an insulating substrate, the elements including gate electrodes and row wirings; forming a gate insulating film on the insulating substrate, the gate electrodes, and the row wirings; forming semiconductor patterns so as to overlap with the respective gate electrodes; forming elements on the gate insulating film and the semiconductor patterns, the elements including column wirings, source connecting wirings, source electrodes, drain electrodes, drain connecting wirings, and drain pads; forming an interlayer insulating film on the column wirings, the source connecting wirings, the source electrodes, the drain electrodes, the drain connecting wirings, and the drain pads; forming capacitor electrodes and capacitor wirings on the interlayer insulating film; forming a capacitor insulating film on the interlayer insulating film, the capacitor electrodes, and the capacitor wirings; forming drain connecting openings in the capacitor insulating film and the interlayer insulating film so as to be positioned above the respective drain pads; forming lower pixel electrodes on the capacitor insulating film, at positions establishing connection with the respective drain pads through the drain connecting openings; forming an intermediate insulating film on the capacitor insulating film and the lower pixel electrodes, the intermediate insulating film having openings in portions thereof; and forming upper pixel electrodes on the intermediate insulating film, at positions establishing connection with the respective lower pixel electrodes through the openings.

A method of producing a thin-film transistor array according to a third aspect of the present invention includes steps of at least forming semiconductor patterns on an insulating substrate; forming elements on the insulating substrate and the semiconductor patterns, the elements including column wirings, source connecting wirings, source electrodes, drain electrodes, drain connecting wirings, and drain pads; forming a gate insulating film on the insulating substrate, the semiconductor patterns, the column wirings, the source connecting wirings, the source electrodes, the drain electrodes, the drain connecting wirings, and the drain pads; forming elements on the gate insulating film, the elements including gate electrodes and row wirings; forming an interlayer insulating film on the gate insulating film, the gate electrodes, and the row wirings; forming capacitor electrodes and capacitor wirings on the interlayer insulating film; forming a capacitor insulating film on the interlayer insulating film, the capacitor electrodes, and the capacitor wirings; forming drain connecting openings in the capacitor insulating film, the interlayer insulating film, and the gate insulating film so as to be positioned above the respective drain pads; forming lower pixel electrodes on the capacitor insulating film, at positions establishing connection with the respective drain pads through the drain connecting openings; forming an intermediate insulating film on the capacitor insulating film and the lower pixel electrodes, the intermediate insulating film having openings in portions thereof; and forming upper pixel electrodes on the intermediate insulating film, at positions establishing connection with the respective lower pixel electrodes through the openings.

According to embodiments of the present invention, there can be provided a thin-film transistor array which can reduce power consumption when rewriting the display, and a method of producing the thin-film transistor array.

REFERENCE SIGNS LIST 100, 200 . . . Thin-film transistor array
110, 210 . . . Pixel
111, 211 . . . Thin film transistor
1 . . . Insulating substrate
2 . . . Gate electrode
2L . . . Row wiring (gate wiring)
3 . . . Gate insulating film
4 . . . Source electrode
4L . . . Column wiring (source wiring)
4C . . . Source connecting wiring
5 . . . Drain electrode
5C . . . Drain-connecting wiring
5P . . . Drain pad
6 . . . Semiconductor pattern
7 . . . Interlayer insulating film
8 . . . Capacitor electrode
8L . . . Capacitor wiring
9 . . . Capacitor insulating film
10 . . . Pixel electrode
10A . . . Lower pixel electrode
10B . . . Upper pixel electrode
10I . . . Intermediate insulating film
H1 . . . Opening
H2, H3 . . . Drain connecting opening Obviously, numerous modifications and variations of the present invention are possible in light of the above teachings. It is therefore to be understood that within the scope of the appended claims, the invention may be practiced otherwise than as specifically described herein.

What is claimed is:

1. A method of producing a thin-film transistor array, comprising:
   forming a plurality of gate electrodes and a plurality of row wirings on a surface of an insulating substrate;
   forming a gate insulating film on the insulating substrate such that the gate insulating film covers the gate electrodes and row wirings formed on the surface of the insulating substrate;
   forming a plurality of semiconductor patterns on a surface of the gate insulating film such that the semiconductor patterns overlap with the gate electrodes formed on the surface of the insulating substrate, respectively;
   forming, on the surface of the gate insulating film, a plurality of column wirings, a plurality of source connecting wirings, a plurality of source electrodes, a plurality of drain electrodes, a plurality of drain connecting wirings, and a plurality of drain pads such that the column wirings, the source connecting wirings, the source electrodes, the drain electrodes, the drain connecting wirings, and the drain pads are formed on the surface of the gate insulating film and that the source electrodes and the drain electrodes extend onto surfaces of the semiconductor patterns;
   forming an interlayer insulating film on the gate insulating film such that the interlayer insulating film covers the column wirings, source connecting wirings, source electrodes, drain electrodes, drain connecting wirings, and drain pads formed on the surface of the gate insulating film;

forming a plurality of capacitor electrodes and a plurality of capacitor wirings on a surface of the interlayer insulating film such that the capacitor electrodes have no overlap with the column wirings, respectively;

forming a capacitor insulating film on the interlayer insulating film such that the capacitor insulating film covers the capacitor electrodes and capacitor wirings formed on the surface of the interlayer insulating film;

forming a plurality of drain connecting openings in the capacitor insulating film and the interlayer insulating film such that the drain connecting openings are connected to the drain pads, respectively;

forming a plurality of lower pixel electrodes on a surface of the capacitor insulating film and in the drain connecting openings such that the lower pixel electrodes are connected to the drain pads through the drain connecting openings, overlap with the capacitor electrodes and have no overlap with the column wirings, respectively;

forming an intermediate insulating film on the capacitor insulating film such that the intermediate insulating film covers the lower pixel electrodes formed on the surface of the capacitor insulating film and has a plurality of openings connected to the lower pixel electrodes formed on the surface of the capacitor insulating film, respectively; and forming a plurality of upper pixel electrodes on a surface of the intermediate insulating film and in the openings of the intermediate insulating film such that the upper pixel electrodes are connected to the lower pixel electrodes formed on the surface of the capacitor insulating film through the openings formed in the intermediate insulating film and overlap with the column wirings, respectively.

2. The method of claim 1, wherein the intermediate insulating film is a resin.

3. The method of claim 2, wherein the opening of the intermediate insulating film is formed to have a forward tapered shape in a cross-sectional view perpendicular to the lamination direction.

4. The method of claim 3, wherein the semiconductor pattern comprises amorphous silicon, and the intermediate insulating film is formed to have light transmittance of 50% or less in a wavelength range of 500 nm to 600 nm.

5. The method of claim 4, wherein the gate insulating film, the interlayer insulating film, and the capacitor insulating film comprise inorganic materials.

6. The method of claim 3, wherein the gate insulating film, the interlayer insulating film, and the capacitor insulating film comprise inorganic materials.

7. The method of claim 2, wherein the semiconductor pattern comprises amorphous silicon, and the intermediate insulating film is formed to have light transmittance of 50% or less in a wavelength range of 500 nm to 600 nm.

8. The method of claim 7, wherein the gate insulating film, the interlayer insulating film, and the capacitor insulating film comprise inorganic materials.

9. The method of claim 2, wherein the gate insulating film, the interlayer insulating film, and the capacitor insulating film comprise inorganic materials.

10. The method of claim 2, wherein the semiconductor pattern comprises amorphous silicon.

11. The method of claim 2, wherein the intermediate insulating film is formed to have light transmittance of 50% or less in a wavelength range of 500 nm to 600 nm.

12. The method of claim 1, wherein the opening of the intermediate insulating film is formed to have a forward tapered shape in a cross-sectional view perpendicular to the lamination direction.

13. The method of claim 12, wherein the semiconductor pattern comprises amorphous silicon, and the intermediate insulating film is formed to have light transmittance of 50% or less in a wavelength range of 500 nm to 600 nm.

14. The method of claim 13, wherein the gate insulating film, the interlayer insulating film, and the capacitor insulating film comprise inorganic materials.

15. The method of claim 12, wherein the gate insulating film, the interlayer insulating film, and the capacitor insulating film comprise inorganic materials.

16. The method of claim 1, wherein the semiconductor pattern comprises amorphous silicon, and the intermediate insulating film is formed to have light transmittance of 50% or less in a wavelength range of 500 nm to 600 nm.

17. The method of claim 16, wherein the gate insulating film, the interlayer insulating film, and the capacitor insulating film comprise inorganic materials.

18. The method of claim 1, wherein the gate insulating film, the interlayer insulating film, and the capacitor insulating film comprise inorganic materials.

19. The method of claim 1, wherein the semiconductor pattern comprises amorphous silicon.

20. The method of claim 1, wherein the intermediate insulating film is formed to have light transmittance of 50% or less in a wavelength range of 500 nm to 600 nm.

* * * * *